US009012928B2

(12) United States Patent
Sugizaki

(10) Patent No.: US 9,012,928 B2
(45) Date of Patent: Apr. 21, 2015

(54) SEMICONDUCTOR LIGHT EMITTING DEVICE AND METHOD FOR MANUFACTURING SAME

(71) Applicant: Kabushiki Kaisha Toshiba, Tokyo (JP)

(72) Inventor: Yoshiaki Sugizaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/786,389

(22) Filed: Mar. 5, 2013

(65) Prior Publication Data

US 2013/0248893 A1 Sep. 26, 2013

(30) Foreign Application Priority Data

Mar. 23, 2012 (JP) .................................. 2012-067428

(51) Int. Cl.
- *H01L 29/18* (2006.01)
- *H01L 33/50* (2010.01)
- *H01L 25/075* (2006.01)

(52) U.S. Cl.
CPC .......... *H01L 33/502* (2013.01); *H01L 25/0753* (2013.01); *H01L 33/508* (2013.01)

(58) Field of Classification Search
CPC ......... H01L 33/00; H01L 33/36; H01L 33/42; H01L 33/46; H01L 33/382; H01L 33/502; H01L 31/143; H01L 31/147
USPC .................... 438/28, 29; 257/88, 98, E33.061
See application file for complete search history.

(56) References Cited

U.S. PATENT DOCUMENTS

| 2005/0269938 | A1* | 12/2005 | Toki et al. ...................... 313/496 |
| 2008/0315749 | A1* | 12/2008 | Kwon ............................ 313/486 |
| 2010/0148198 | A1* | 6/2010 | Sugizaki et al. ................ 257/98 |
| 2010/0157583 | A1 | 6/2010 | Nakajima |
| 2011/0300644 | A1 | 12/2011 | Akimoto et al. |
| 2012/0056525 | A1 | 3/2012 | Ishida et al. |

FOREIGN PATENT DOCUMENTS

| JP | 2010087292 A | 4/2010 |
| JP | 2011138985 A | 7/2011 |

(Continued)

OTHER PUBLICATIONS

Japanese Office Action dated Jun. 25, 2014 in counterpart Japanese Application No. 2012-067428.

(Continued)

*Primary Examiner* — Brook Kebede
(74) *Attorney, Agent, or Firm* — Holtz, Holtz, Goodman & Chick PC

(57) ABSTRACT

According to one embodiment, a semiconductor light emitting device includes a plurality of chips, and a phosphor layer. Each of the plurality of chips includes a semiconductor layer, a p-side electrode, and an n-side electrode. The semiconductor layer has a first surface, a second surface opposite to the first surface, and a light emitting layer. The p-side electrode is provided in an emitting region on the second surface. The n-side electrode is provided in an non-emitting region on the second surface. The phosphor layer is provided on the first surface side of the chips. The phosphor layer includes a transparent body and a phosphor dispersed in the transparent body. A gap not including the phosphor is provided in the phosphor layer. The plurality of chips includes a plurality of chips for which the gap has different sizes.

29 Claims, 22 Drawing Sheets

(56) References Cited

FOREIGN PATENT DOCUMENTS

| JP | 2012019201 A | 1/2012 |
|----|--------------|--------|
| JP | 2012059824 A | 3/2012 |
| JP | 2013110227 A | 6/2013 |
| WO | WO 2009/123726 A2 | 10/2009 |

OTHER PUBLICATIONS

Japanese Office Action dated Sep. 2, 2014 in counterpart Japanese Application No. 2012-067428.
Japanese Office Action dated Nov. 18, 2014, issued in counterpart Japanese Application No. 2012-067428.

* cited by examiner

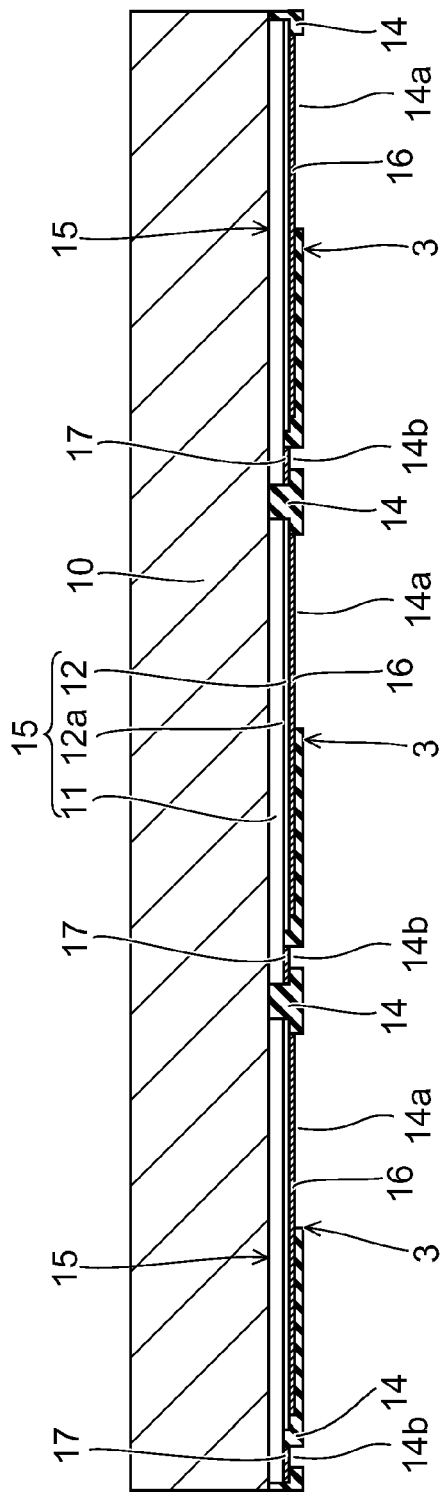
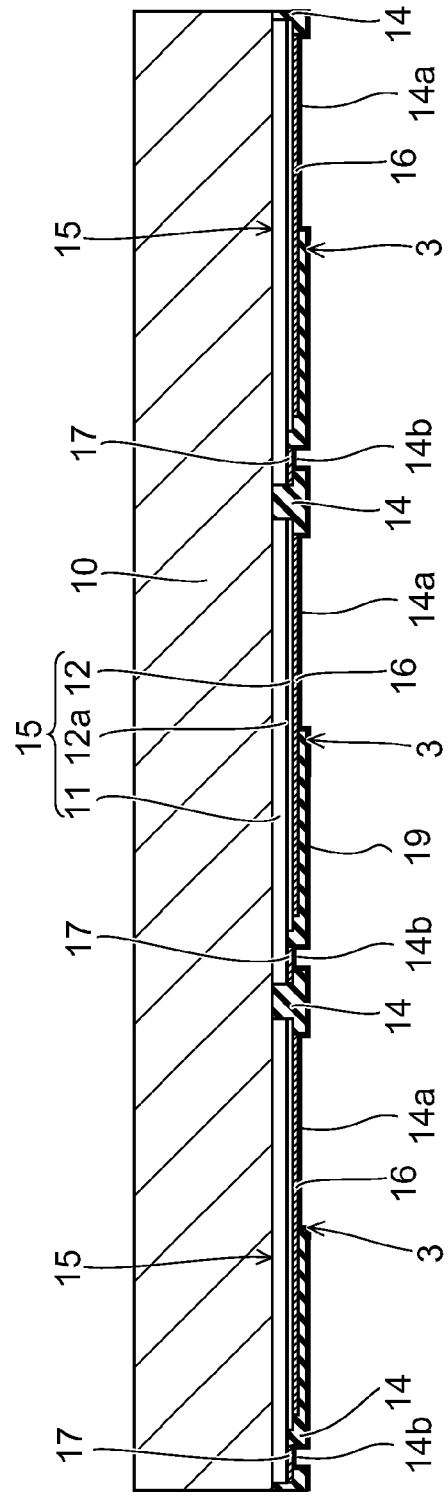
FIG. 3A
FIG. 3B

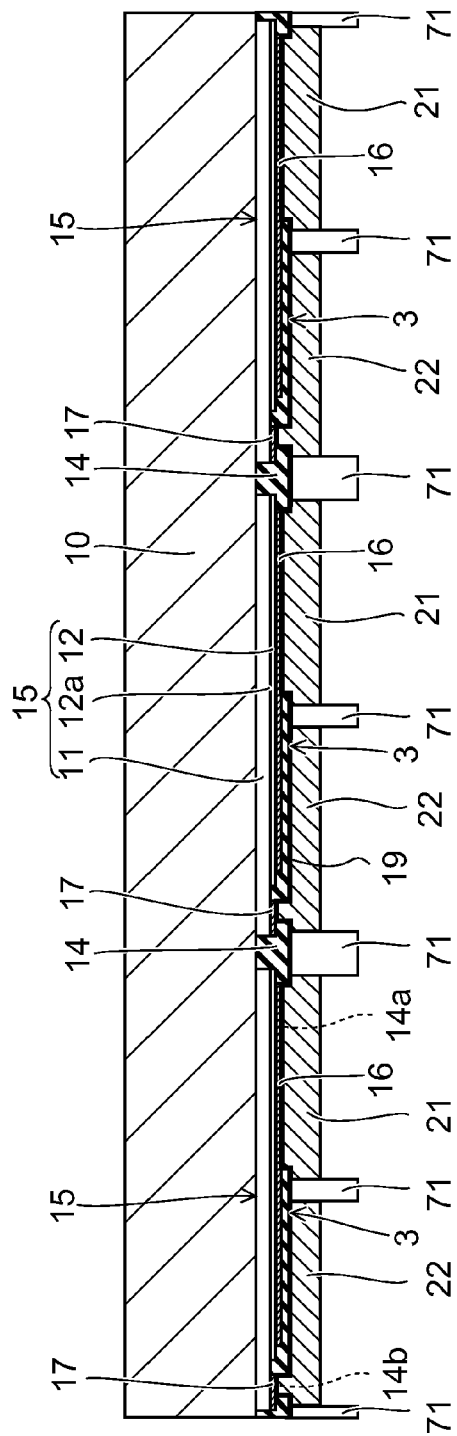
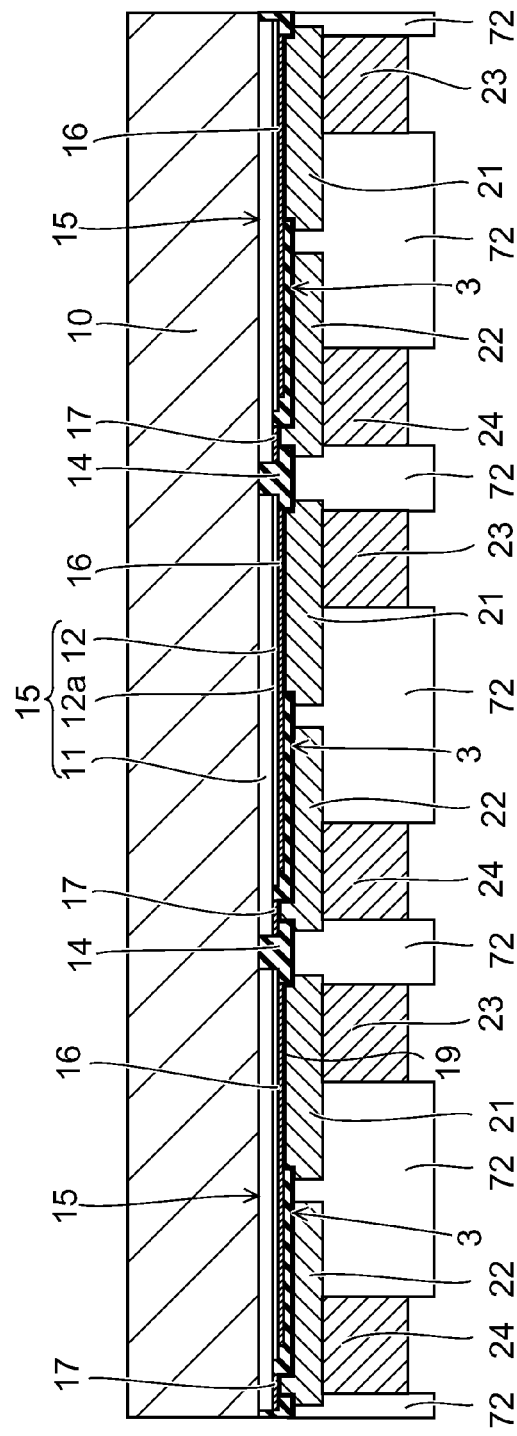
FIG. 4A
FIG. 4B

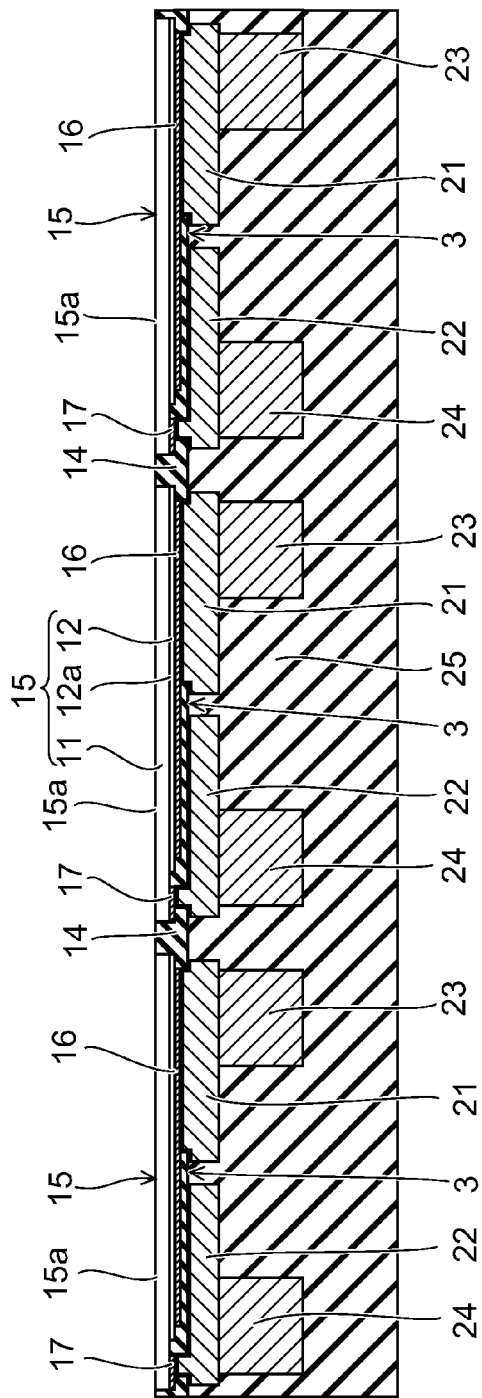
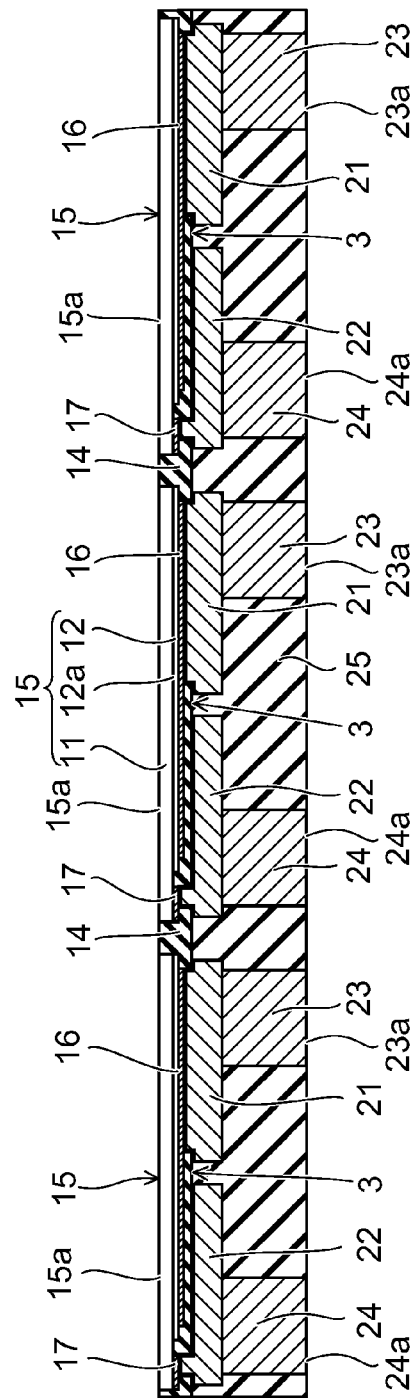
FIG. 6A
FIG. 6B

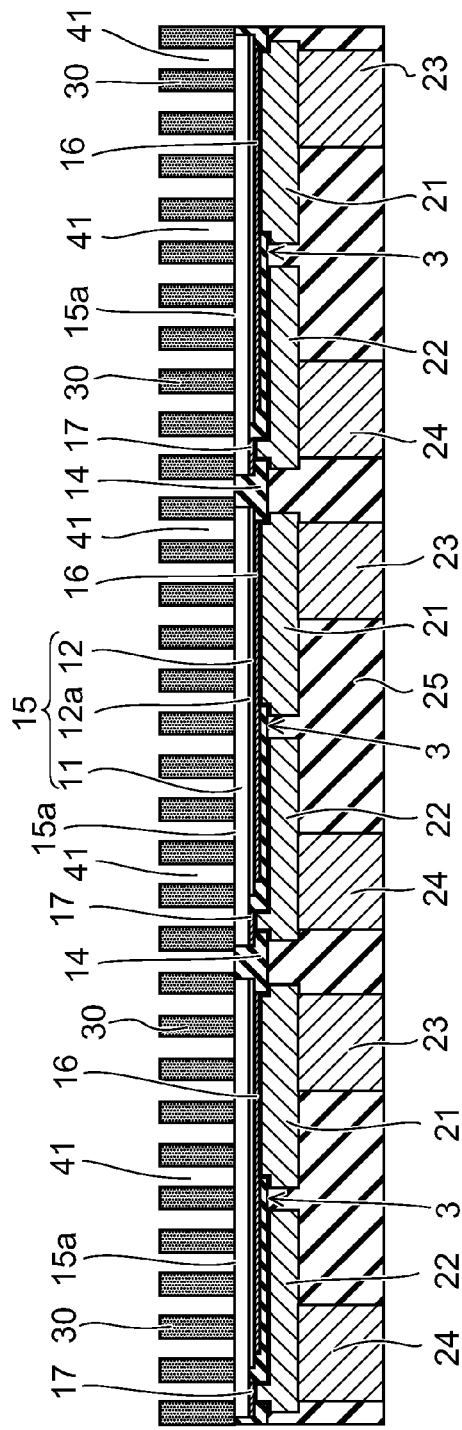
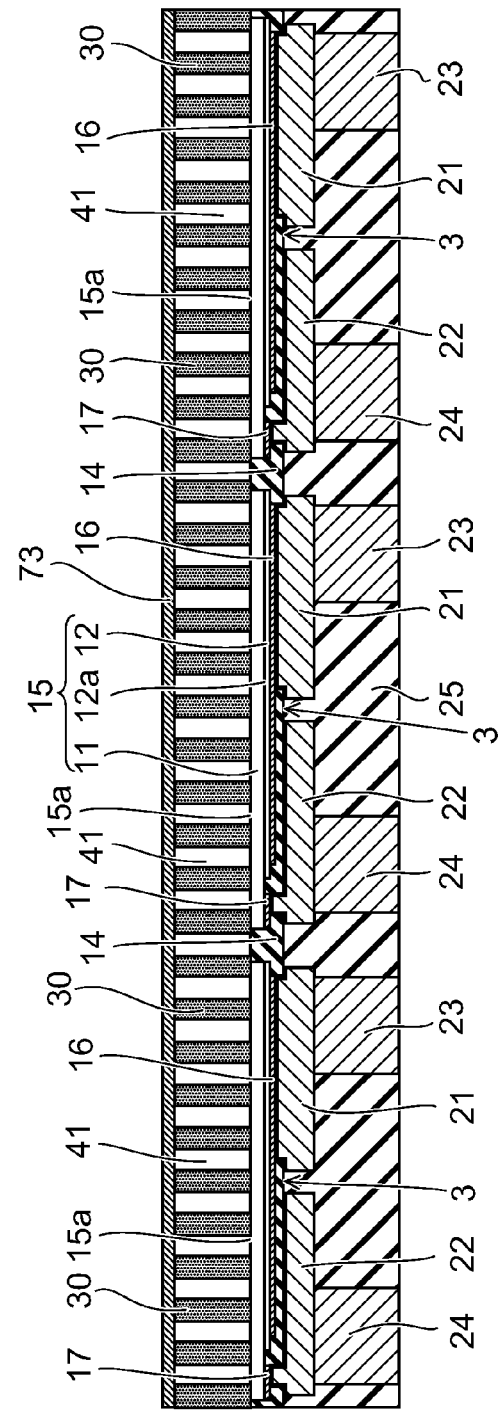
FIG. 7A
FIG. 7B

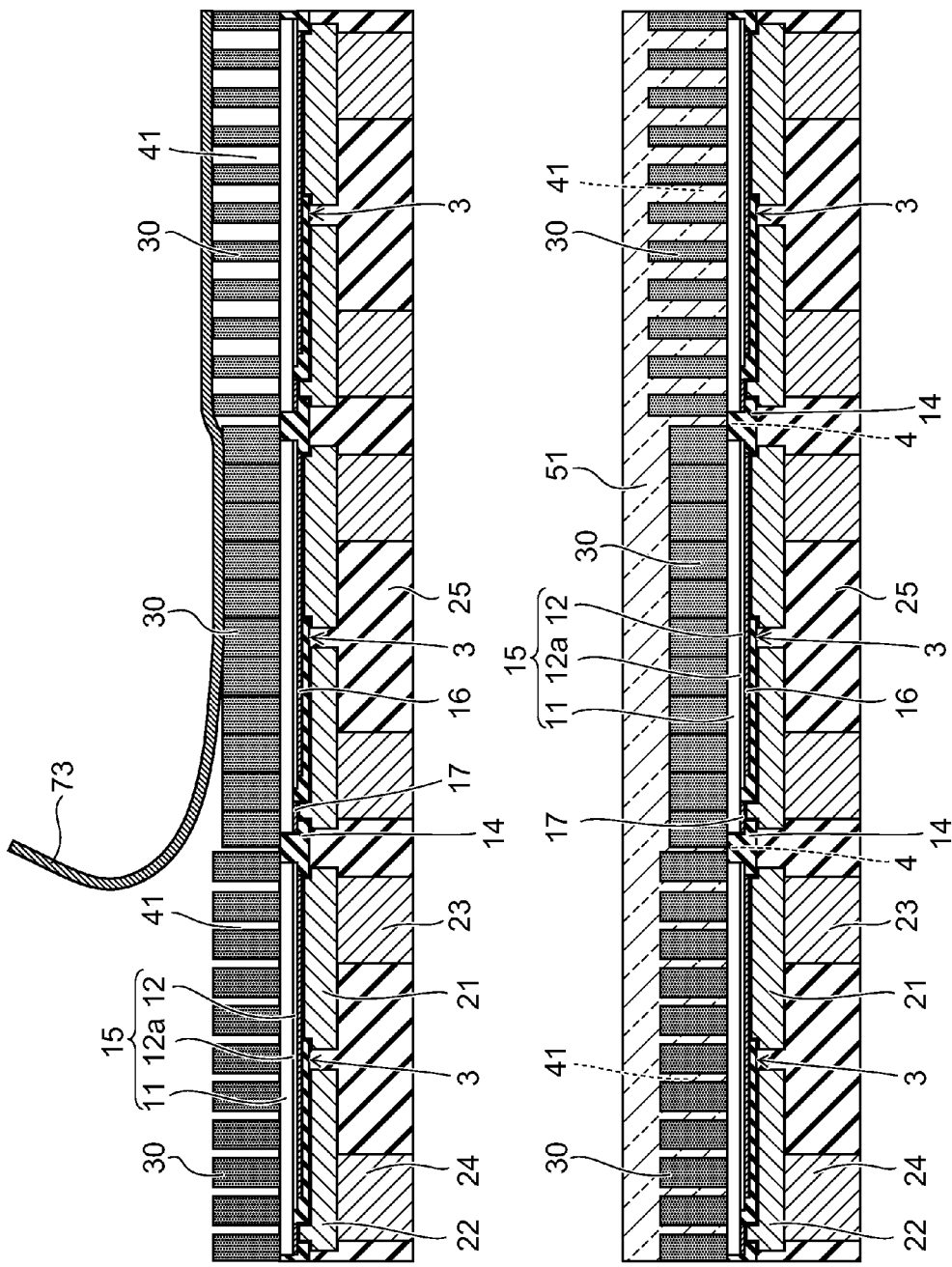

SEMICONDUCTOR LIGHT EMITTING DEVICE AND METHOD FOR MANUFACTURING SAME

CROSS-REFERENCE TO RELATED APPLICATION

This application is based upon and claims the benefit of priority from Japanese Patent Application No. 2012-067428, filed on Mar. 23, 2012; the entire contents of which are incorporated herein by reference.

FIELD

Embodiments described herein relate generally to a semiconductor light emitting device and a method for manufacturing a semiconductor light emitting device.

BACKGROUND

One major challenge in the development of a white LED (Light Emitting Diode) is the reduction of chromaticity fluctuation. In particular, the fluctuation of the light emission wavelength between chips in the wafer greatly affects the chromaticity fluctuation in wafer level LED packaging technology in which the formation of the interconnect layer, the protective resin, and the phosphor layer progresses collectively for the multiple chips in the wafer without using a chip screening process.

BRIEF DESCRIPTION OF THE DRAWINGS

FIG. 2A to FIG. 11B are schematic cross-sectional views showing a method for manufacturing the light emitting device of the first embodiment;

DETAILED DESCRIPTION

Figure 1:
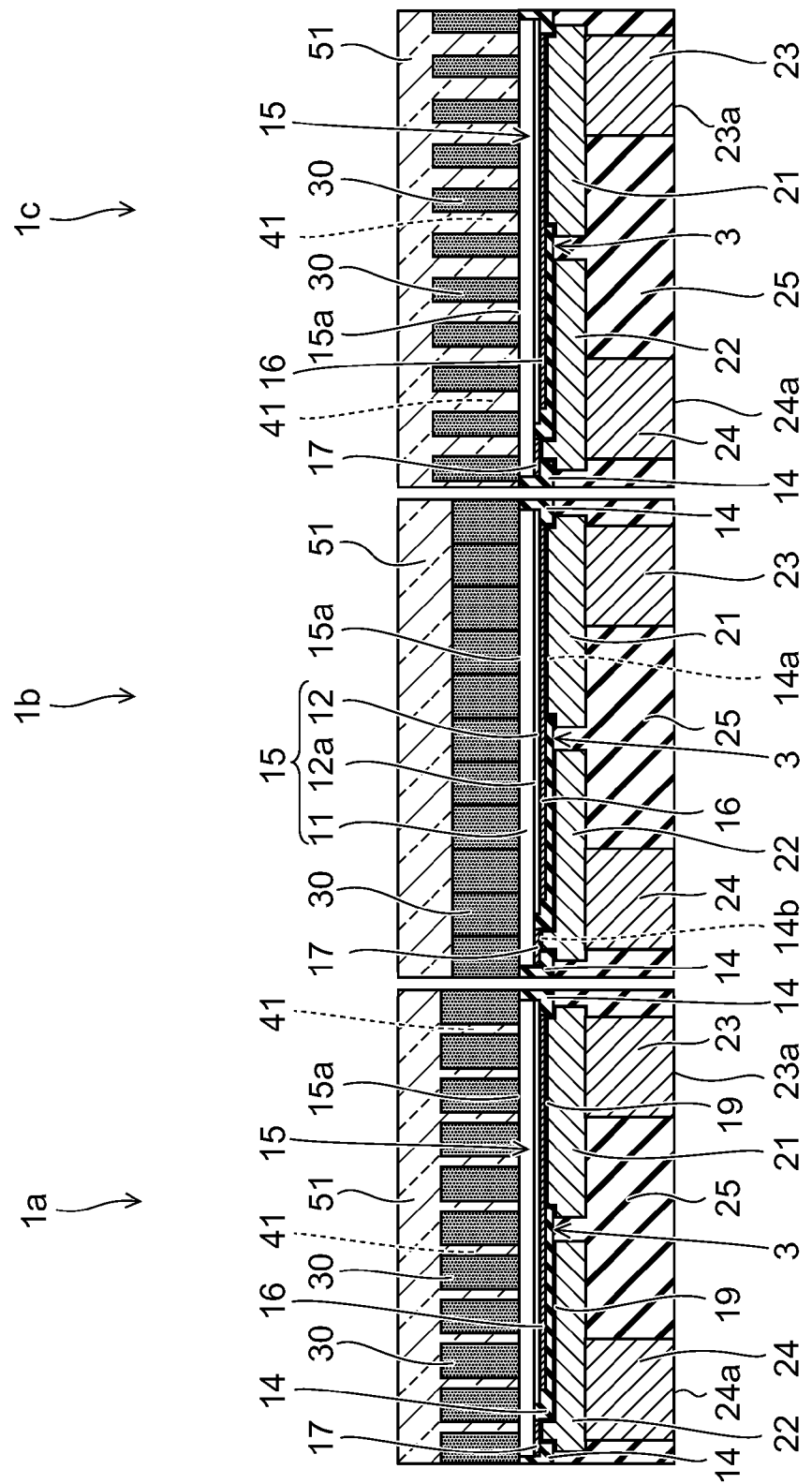
FIG. 1 is a schematic cross-sectional view of a semiconductor light emitting device of a first embodiment.

According to one embodiment, a semiconductor light emitting device includes a plurality of chips, and a phosphor layer. Each of the plurality of chips includes a semiconductor layer, a p-side electrode, and an n-side electrode. The semiconductor layer has a first surface, a second surface opposite to the first surface, and a light emitting layer. The p-side electrode is provided in an emitting region on the second surface. The n-side electrode is provided in an non-emitting region on the second surface. The phosphor layer is provided on the first surface side of the chips. The phosphor layer includes a transparent body and a phosphor dispersed in the transparent body. A gap not including the phosphor is provided in the phosphor layer. The plurality of chips includes a plurality of chips for which the gap has different sizes.

Embodiments will now be described with reference to the drawings. Similar components in the drawings are marked with like reference numerals.

First Embodiment

FIG. 1 is a schematic cross-sectional view of a semiconductor light emitting device of a first embodiment.

FIG. 1 shows, for example, three semiconductor light emitting devices 1a to 1c singulated from the wafer state. As described below, the components included in each of the three semiconductor light emitting devices 1a to 1c are collectively formed in the wafer state prior to the singulation.

Each of the semiconductor light emitting devices 1a to 1c includes a chip 3 and a phosphor layer 30 provided on the chip 3. For the three semiconductor light emitting devices 1a to 1c, the sizes of gaps 41 (also including the case where the size of the gap 41 is zero, i.e., the case where there is no gap 41) made in the phosphor layer 30 are different; the structures of the chips 3 are the same; and the structures of the support bodies of the chips 3 are the same.

The chip 3 includes a semiconductor layer 15. The chip 3 may include a buffer layer or an adhesion layer. The phosphor layer 30 may be provided on the adhesion layer. The semiconductor layer 15 has a first surface 15a and a second surface provided on the side opposite to the first surface 15a. Light is emitted to the outside mainly from the first surface (in FIG. 1, the top surface) 15a of the semiconductor layer 15. A p-side electrode 16 and an n-side electrode 17 are provided on the second surface of the semiconductor layer 15.

The semiconductor layer 15 includes a first semiconductor layer 11 and a second semiconductor layer 12. The first semiconductor layer 11 and the second semiconductor layer 12 are made of materials including, for example, gallium nitride. The first semiconductor layer 11 includes, for example, an n-type layer that functions as a lateral-direction path of the current, etc. The second semiconductor layer 12 includes a p-type layer and a light emitting layer (an active layer) 12a.

The second surface of the semiconductor layer 15 is patterned into an uneven configuration; and a portion of the light emitting layer 12a is removed. Accordingly, the second surface of the semiconductor layer 15 has a light emitting region including the light emitting layer 12a (or opposing the light emitting layer 12a), and a non-light emitting region not including the light emitting layer 12a (or not opposing the light emitting layer 12a).

The p-side electrode 16 is provided in the light emitting region of the second surface; and the n-side electrode 17 is provided in the non-light emitting region of the second surface. At the second surface, the surface area of the light emitting region is greater than the surface area of the non-light emitting region. The surface area of the p-side electrode 16 spreading over the second surface (the light emitting region) is greater than the surface area of the n-side electrode 17 spreading over the second surface (the non-light emitting region).

A first insulating layer (hereinbelow, called simply the insulating layer) 14 is provided on the second surface side. The insulating layer 14 is provided also on the side surface of the semiconductor layer 15. The insulating layer 14 covers the portion of the second surface where the p-side electrode 16 and the n-side electrode 17 are not provided.

The insulating layer 14 is, for example, a resin such as polyimide, etc., having excellent patternability of fine openings. Or, an inorganic substance such as silicon oxide and/or silicon nitride, etc., may be used as the insulating layer 14.

The insulating layer 14 covers a portion of the p-side electrode 16 and a portion of the n-side electrode 17. The insulating layer 14 is not provided on the first surface 15a. The side surface of the semiconductor layer 15 continuing from the first surface 15a is covered with the insulating layer 14. The insulating layer 14 and a resin layer 25 described below form the side surface of the semiconductor light emitting device; and the chip 3 including the semiconductor layer 15 is not exposed at the side surface of the semiconductor light emitting device.

Multiple first openings 14a that reach the p-side electrode 16 and a second opening 14b that reaches the n-side electrode 17 are made in the insulating layer 14.

A p-side interconnect layer 21 and an n-side interconnect layer 22 are provided to be separated from each other on the insulating layer 14. The p-side interconnect layer 21 is provided also inside the first openings 14a and is electrically connected to the p-side electrode 16. The n-side interconnect layer 22 is provided also inside the second opening 14b and is electrically connected to the n-side electrode 17.

The p-side interconnect layer 21 and the n-side interconnect layer 22 are formed by, for example, electroplating as described below. A metal film 19 used as a seed metal during the plating is provided between the p-side interconnect layer 21 and the insulating layer 14 and between the n-side interconnect layer 22 and the insulating layer 14.

A p-type metal pillar 23 is provided on the surface of the p-side interconnect layer 21 on the side opposite to the chip 3. The p-type metal pillar 23 is thicker than the p-side interconnect layer 21. The p-side interconnect layer 21 and the p-type metal pillar 23 are included in a p-side interconnect unit of the embodiment.

An n-side metal pillar 24 is provided on the surface of the n-side interconnect layer 22 on the side opposite to the chip 3. The n-side metal pillar 24 is thicker than the n-side interconnect layer 22. The n-side interconnect layer 22 and the n-side metal pillar 24 are included in an n-side interconnect unit of the embodiment.

The resin layer 25 is provided as a second insulating layer on the insulating layer 14. The resin layer 25 covers the periphery of the p-side interconnect unit and the periphery of the n-side interconnect unit.

The surface of the p-side interconnect layer 21 other than the connection surface between the p-side interconnect layer 21 and the p-type metal pillar 23 and the surface of the n-side interconnect layer 22 other than the connection surface between the n-side interconnect layer 22 and the n-side metal pillar 24 are covered with the resin layer 25. The resin layer 25 is provided between the p-type metal pillar 23 and the n-side metal pillar 24 and covers the side surface of the p-type metal pillar 23 and the side surface of the n-side metal pillar 24. The resin layer 25 is filled between the p-type metal pillar 23 and the n-side metal pillar 24.

The surface of the p-type metal pillar 23 on the side opposite to the p-side interconnect layer 21 is exposed without being covered with the resin layer 25 and functions as a p-side external terminal 23a to be bonded to the mounting substrate. The surface of the n-side metal pillar 24 on the side opposite to the n-side interconnect layer 22 is exposed without being covered with the resin layer 25 and functions as an n-side external terminal 24a to be bonded to the mounting substrate.

The thicknesses of the p-side interconnect unit, the n-side interconnect unit, and the resin layers 25 are thicker than the thickness of the semiconductor layer 15. The aspect ratios (the ratios of the thickness to the planar size) of the p-type metal pillar 23 and the n-side metal pillar 24 are not limited to being 1 or more and may be smaller than 1.

The p-type metal pillar 23, the n-side metal pillar 24, and the resin layer 25 that reinforces the p-type metal pillar 23 and the n-side metal pillar 24 function as a support body of the chip 3 including the semiconductor layer 15. Accordingly, even if the substrate used to form the semiconductor layer 15 is removed as described below, the semiconductor layer 15 can be stably supported by the support body including the p-type metal pillar 23, the n-side metal pillar 24, and the resin layer 25; and the mechanical strength of the semiconductor light emitting device can be increased.

The stress applied to the semiconductor layer 15 in the state in which the semiconductor light emitting device is mounted on the mounting substrate can be relaxed by being absorbed by the p-type metal pillar 23 and the n-side metal pillar 24.

Copper, gold, nickel, silver, etc., may be used as the materials of the p-side interconnect layer 21, the n-side interconnect layer 22, the p-type metal pillar 23, and the n-side metal pillar 24. Among these, good thermal conductivity, high migration resistance, and excellent adhesion with insulating materials are obtained when copper is used.

It is desirable for the resin layer 25 to have a coefficient of thermal expansion near to or the same as that of the mounting substrate. Examples of such a resin layer include, for example, an epoxy resin, a silicone resin, a fluorocarbon resin, etc.

The first semiconductor layer 11 is electrically connected to the n-side metal pillar 24 including the n-side external terminal 24a via the n-side electrode 17 and the n-side interconnect layer 22. The second semiconductor layer 12 including the light emitting layer 12a is electrically connected to the p-type metal pillar 23 including the p-side external terminal 23a via the p-side electrode 16 and the p-side interconnect layer 21.

A portion of the n-side interconnect layer 22 overlaps the portion on the insulating layer 14 that opposes the light emitting layer 12a. The surface area of the n-side interconnect layer 22 spreading on the insulating layer 14 is greater than the surface area of the n-side interconnect layer 22 where the n-side interconnect layer 22 connects to the n-side electrode 17.

According to the embodiment, a high light output can be obtained by the light emitting layer 12a being formed over the region that is larger than the n-side electrode 17. Further, a structure can be realized in which the n-side electrode 17 provided in the non-light emitting region, which does not include the light emitting layer 12a and is narrower than the light emitting region where the p-side electrode 16 is provided, is redisposed on the mounting surface side as the n-side interconnect layer 22 having a larger surface area.

The surface area where the p-side interconnect layer 21 connects to the p-side electrode 16 via the first openings 14a is greater than the surface area where the n-side interconnect layer 22 connects to the n-side electrode 17 via the second opening 14b. Therefore, the current distribution to the light emitting layer 12a can be improved; and the heat dissipation of the heat generated at the light emitting layer 12a can be improved.

The phosphor layer 30 is provided on the first surface 15a of the semiconductor layer 15. The phosphor layer 30 includes multiple phosphors having a powder or particle configuration that are capable of absorbing the emitted light (the excitation light) of the light emitting layer 12a and emitting a wavelength-converted light. The phosphors are dispersed in, for example, a transparent resin as a first transparent body that is transparent to the light emitted by the light emitting layer 12a and the emitted light (the wavelength-converted light) of the phosphors. The semiconductor light emitting device of the embodiment is capable of emitting a mixed light of the light from the light emitting layer 12a and the wavelength-converted light from the phosphors.

For example, white, lamp, etc., can be obtained as a mixed color of the blue light from the light emitting layer 12a which is a GaN-based material and the yellow light which is the wavelength-converted light of the phosphor layer 30 in the case where the phosphors are yellow phosphors that emit yellow light. Or, the phosphor layer 30 may have a configuration including multiple types of phosphors (e.g., red phosphors that emit red light and green phosphors that emit green light).

Of the three semiconductor light emitting devices 1a to 1c shown in FIG. 1, for example, the multiple gaps 41 are made in the phosphor layer 30 of the semiconductor light emitting device 1a and the semiconductor light emitting device 1c. The gaps 41 do not include the phosphors; and, for example, a transparent resin 51 is filled into the gaps 41 as a second transparent body that is transparent to the light emitted by the light emitting layer 12a and the emitted light (the wavelength-converted light) of the phosphors.

The gaps are not made in, for example, the phosphor layer 30 of the semiconductor light emitting device 1b shown in the middle of FIG. 1.

Figure 20:
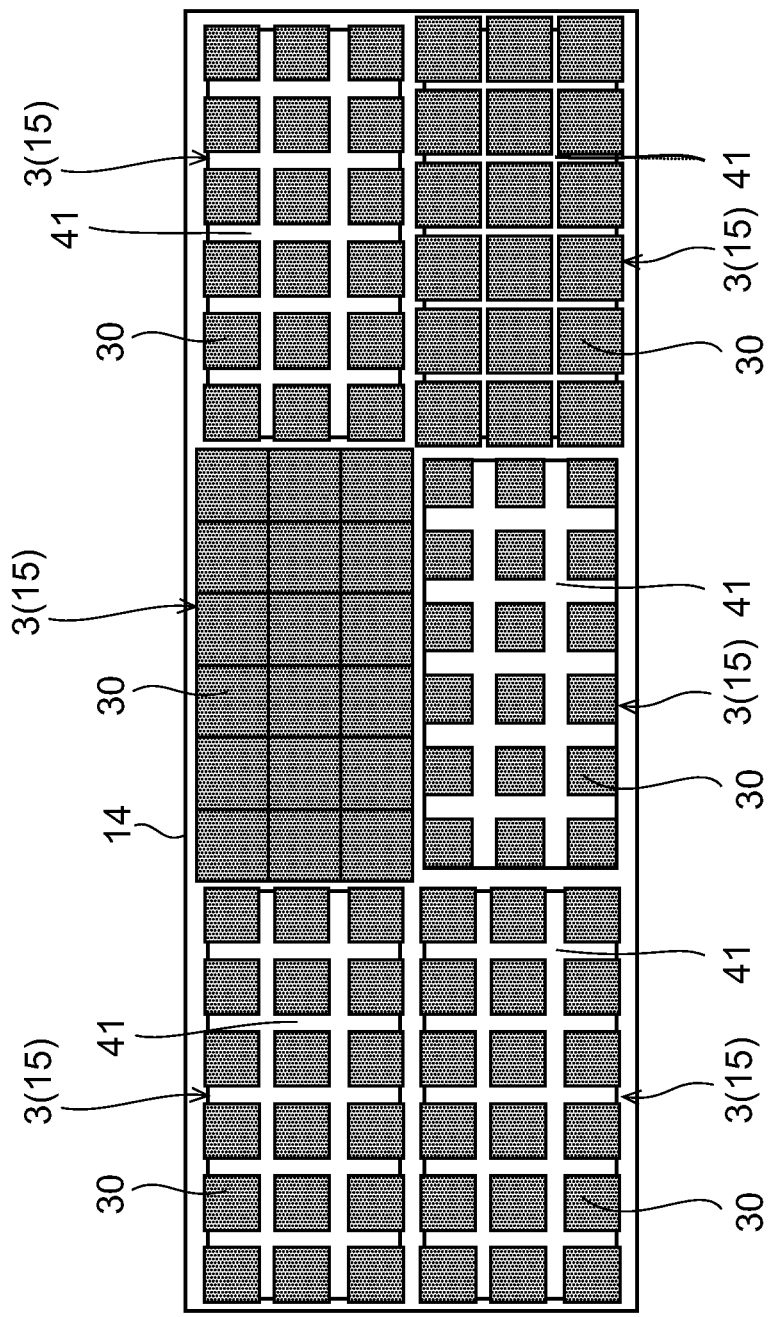
Figure 22:
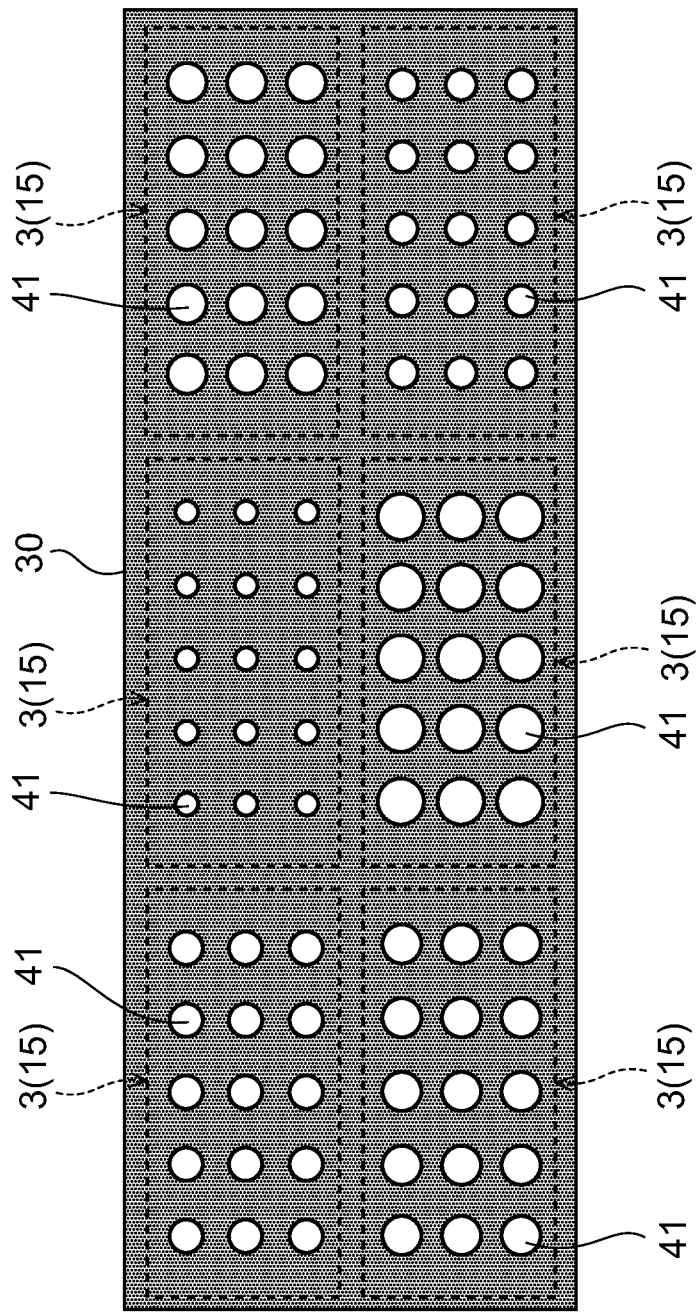

FIG. 20 and FIG. 22 are schematic top views of the phosphor layer 30 in the wafer state prior to the singulation.

As shown in FIG. 20, the gaps 41 are made in, for example, lattice trench configurations; and the phosphor layer 30 is separated into multiple pillar units.

Or, as shown in FIG. 22, the gaps 41 are made as holes provided inside the phosphor layer 30.

The size of the gap 41 is different between the semiconductor light emitting device 1a and the semiconductor light emitting device 1c. The size of the gap 41 refers to, for example, the volume, the width, the diameter, the depth (the height direction dimension), etc., of the gap 41. In the semiconductor light emitting device 1b, there is no gap, i.e., the size of the gap is zero.

For example, the width or the diameter is larger and the depth (the height direction dimension) is larger for the gap 41 of the semiconductor light emitting device 1c than for the gap 41 of the semiconductor light emitting device 1a. In other words, the volume of the gap 41 of the semiconductor light emitting device 1c is larger than the volume of the gap 41 of the semiconductor light emitting device 1a.

The proportion of the wavelength-converted light from the phosphor layer 30 relatively decreases as the size of the gap 41 not including the phosphor increases; and there is a tendency for the mixed light to be of a wavelength near the light emission color (e.g., blue) of the light emitting layer 12a of the chip 3.

The chromaticity of the mixed light of the light emitted by the chip 3 and the wavelength-converted light of the phosphor layer 30 can be controlled by appropriately adjusting the size of the gap 41 (including the size being zero) between the chips 3. Accordingly, even in the case where the light emission color fluctuates between the chips 3 on the wafer, it is possible to match the emitted light (the mixed light) of the semiconductor light emitting device to have the desired chromaticity by adjusting the size of the gap 41 of the phosphor layer 30.

A method for manufacturing the semiconductor light emitting device of the embodiment including the adjustment process of the size of the gap 41 will now be described with reference to FIG. 2A to FIG. 11B.

Figure 2A:
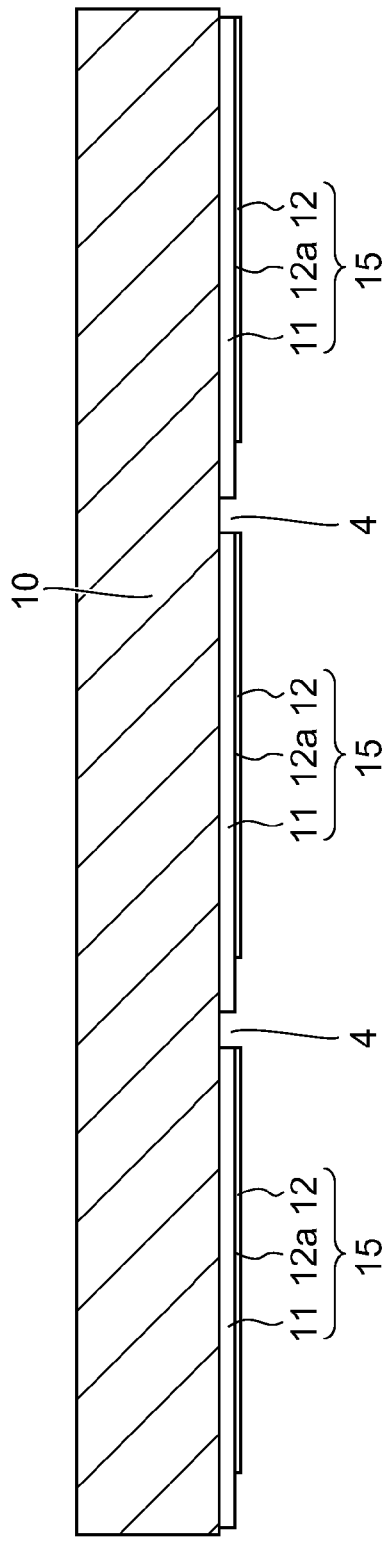

FIG. 2A shows the cross section of a wafer in which the semiconductor layer 15 including the first semiconductor layer 11 and the second semiconductor layer 12 is formed on a major surface (in the drawing, the lower surface) of a substrate 10. The first semiconductor layer 11 is formed on the major surface of the substrate 10; and the second semiconductor layer 12 is formed on the first semiconductor layer 11.

For example, the first semiconductor layer 11 and the second semiconductor layer 12 made of gallium nitride materials may be epitaxially grown by MOCVD (metal organic chemical vapor deposition) on a sapphire substrate. Or, a silicon substrate may be used as the substrate 10.

The first semiconductor layer 11 includes a foundation buffer layer and an n-type GaN layer. The second semiconductor layer 12 includes the light emitting layer 12a and a p-type GaN layer. The light emitting layer 12a may include a substance that emits blue light, violet light, bluish-violet light, near-ultraviolet light, ultraviolet light, etc.

After forming the semiconductor layer 15 on the substrate 10, the first semiconductor layer 11 is selectively exposed by selectively removing the second semiconductor layer 12 by, for example, RIE (Reactive Ion Etching) using a not-shown resist. The region where the first semiconductor layer 11 is exposed does not include the light emitting layer 12a.

A trench 4 is made to reach the substrate 10 by piercing the semiconductor layer 15 by, for example, RIE using a not-shown resist mask. The trench 4 is made in, for example, a planar pattern having a lattice configuration on the substrate 10 in the wafer state. The semiconductor layer 15 is separated into a plurality by the trench 4.

The process of separating the semiconductor layer 15 into the plurality may be performed after forming the p-side electrode 16 and the n-side electrode 17 described below.

Figure 2B:
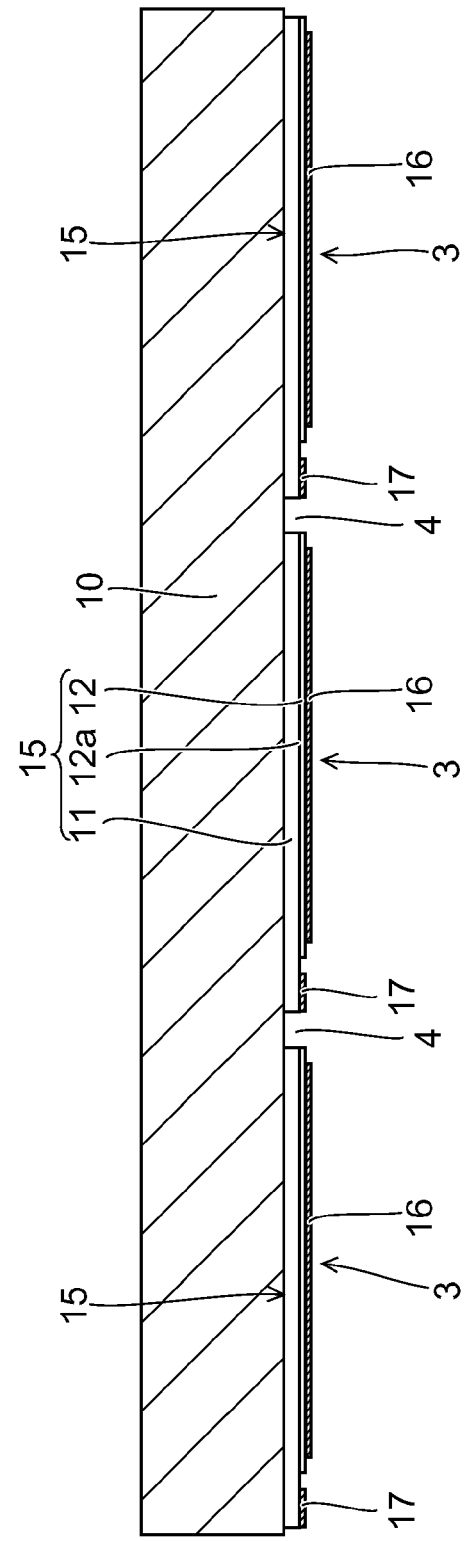

As shown in FIG. 2B, the p-side electrode 16 and the n-side electrode 17 are formed in the second surface (the surface on the side opposite to the substrate 10) of the semiconductor layer 15. The p-side electrode 16 is formed on the surface of the second semiconductor layer 12. The second semiconductor layer 12 is selectively removed; and the n-side electrode 17 is formed on the surface of the first semiconductor layer 11 not including the light emitting layer 12a. The p-side electrode 16 and the n-side electrode 17 are formed by, for example, sputtering, vapor deposition, etc. Either one of the p-side electrode 16 and the n-side electrode 17 may be formed first; and the p-side electrode 16 and the n-side electrode 17 may be formed simultaneously from the same material.

Although not-shown, a passivation film (an insulating film) may be formed on the second surface side if necessary.

Then, all of the exposed portions on the major surface side of the substrate 10 are covered with the insulating layer 14 shown in FIG. 3A. Subsequently, the first openings 14a and the second opening 14b are made in the insulating layer 14 by etching using a not-shown resist mask. The first openings 14a reach the p-side electrode 16; and the second opening 14b reaches the n-side electrode 17.

Continuing as shown in FIG. 3B, the metal film 19 that functions as the seed metal of the plating is formed on the surface of the insulating layer 14, the inner walls (the side walls and the bottom portions) of the first openings 14a, and the inner wall (the side wall and the bottom portion) of the second opening 14b. The metal film 19 has a stacked structure in which, for example, a titanium film and a copper film are formed in order from the insulating layer 14 side. Or, an aluminum film may be used instead of the titanium film.

Then, a resist 71 shown in FIG. 4A is selectively formed on the metal film 19; and Cu electroplating is performed using the metal film 19 as a current path.

The p-side interconnect layer 21 and the n-side interconnect layer 22 are formed by plating to be separated from each other on the insulating layer 14. The p-side interconnect layer 21 and the n-side interconnect layer 22 are made of, for example, copper materials formed simultaneously by plating.

The p-side interconnect layer 21 also is formed inside the first openings 14a and is electrically connected to the p-side electrode 16 via the metal film 19 which is the seed metal. The n-side interconnect layer 22 also is formed inside the second opening 14b and is electrically connected to the n-side electrode 17 via the metal film 19 which is the seed metal.

Then, Cu electroplating using the metal film 19 that still remains as a current path is performed using a resist 72 shown in FIG. 4B as a mask. The p-type metal pillar 23 and the n-side metal pillar 24 are formed by plating as shown in FIG. 4B. The p-type metal pillar 23 is formed on the p-side interconnect layer 21; and the n-side metal pillar 24 is formed on the n-side interconnect layer 22.

Figure 5A:
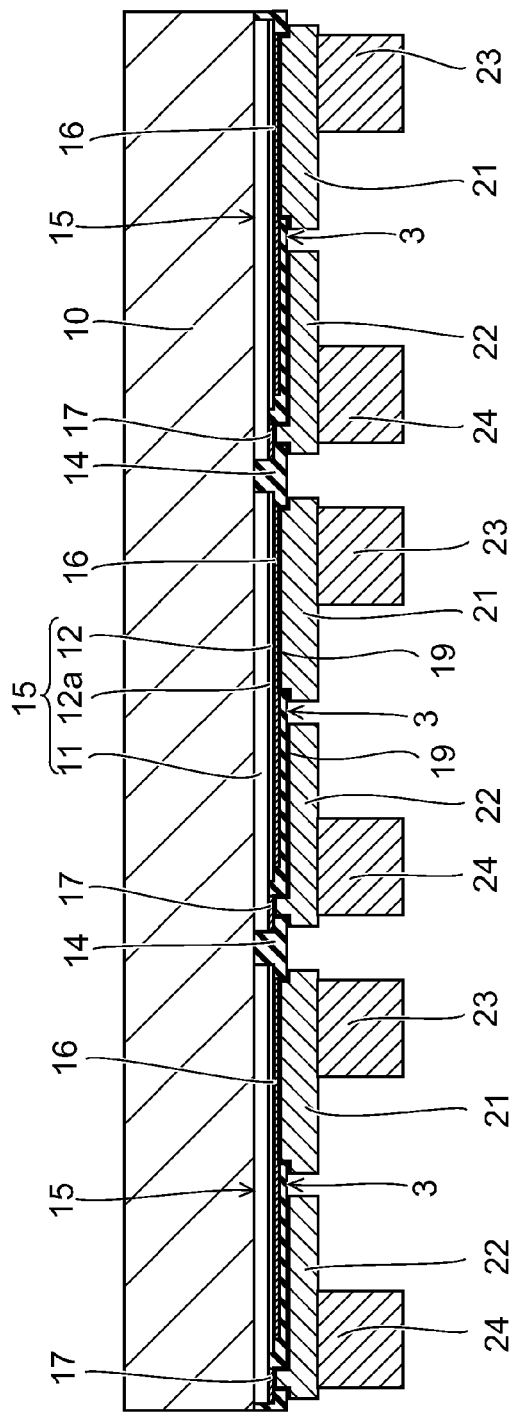

The resist 72 is removed after forming the p-type metal pillar 23 and the n-side metal pillar 24; and the exposed portion of the metal film 19 used as the seed metal is removed as shown in FIG. 5A. Accordingly, the metal film 19 linking the p-side interconnect layer 21 to the n-side interconnect layer 22 is divided.

Figure 5B:
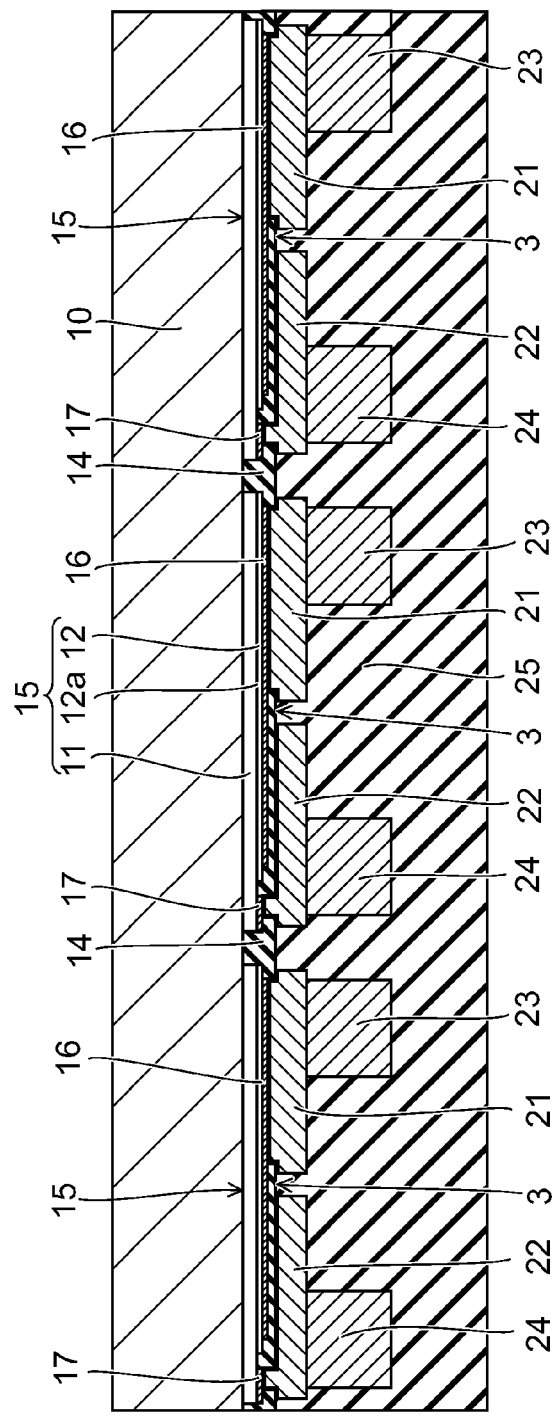

Then, the resin layer 25 shown in FIG. 5B is formed on the insulating layer 14. The resin layer 25 covers the insulating layer 14, the p-side interconnect layer 21, the n-side interconnect layer 22, the p-type metal pillar 23, and the n-side metal pillar 24.

Continuing, the substrate 10 is removed in the state in which the chip 3 is supported by the support body including the p-type metal pillar 23, the n-side metal pillar 24, and the resin layer 25. In the case where the substrate 10 is the sapphire substrate, the substrate 10 can be removed by laser lift-off.

Namely, laser light is irradiated from the back surface side of the substrate 10 toward the first semiconductor layer 11. The substrate 10 is transmissive to the laser light; and the laser light has a wavelength in the absorption region of the first semiconductor layer 11.

When the laser light reaches the interface between the substrate 10 and the first semiconductor layer 11, the first semiconductor layer 11 proximal to the interface decomposes by absorbing the energy of the laser light. For example, the first semiconductor layer 11 of the GaN-based material decomposes into gallium (Ga) and nitrogen gas. A micro gap is made between the substrate 10 and the first semiconductor layer 11 by this decomposition reaction; and the substrate 10 and the first semiconductor layer 11 separate. The irradiation of the laser light is performed over the entire wafer by performing multiply for every set region; and the substrate 10 is removed.

Because the semiconductor layer 15 is supported by the support body that is thicker than the semiconductor layer 15, it is possible to maintain the wafer state even in the case where there is no substrate 10. The resin included in the resin layer 25 and the metals included in the p-type metal pillar 23 and the n-side metal pillar 24 are materials more flexible than the semiconductor layer 15 of the GaN-based material. Therefore, destruction of the chip 3 can be avoided even in the case where the large internal stress generated in the epitaxial growth that forms the semiconductor layer 15 on the substrate 10 is relieved all at once when peeling the substrate 10.

In the case where the substrate 10 is the silicon substrate, the substrate 10 can be removed by wet etching or dry etching. Mechanical polishing of the substrate 10 may be performed prior to the removal of the substrate 10 to make the substrate 10 thinner if necessary.

Figure 18:
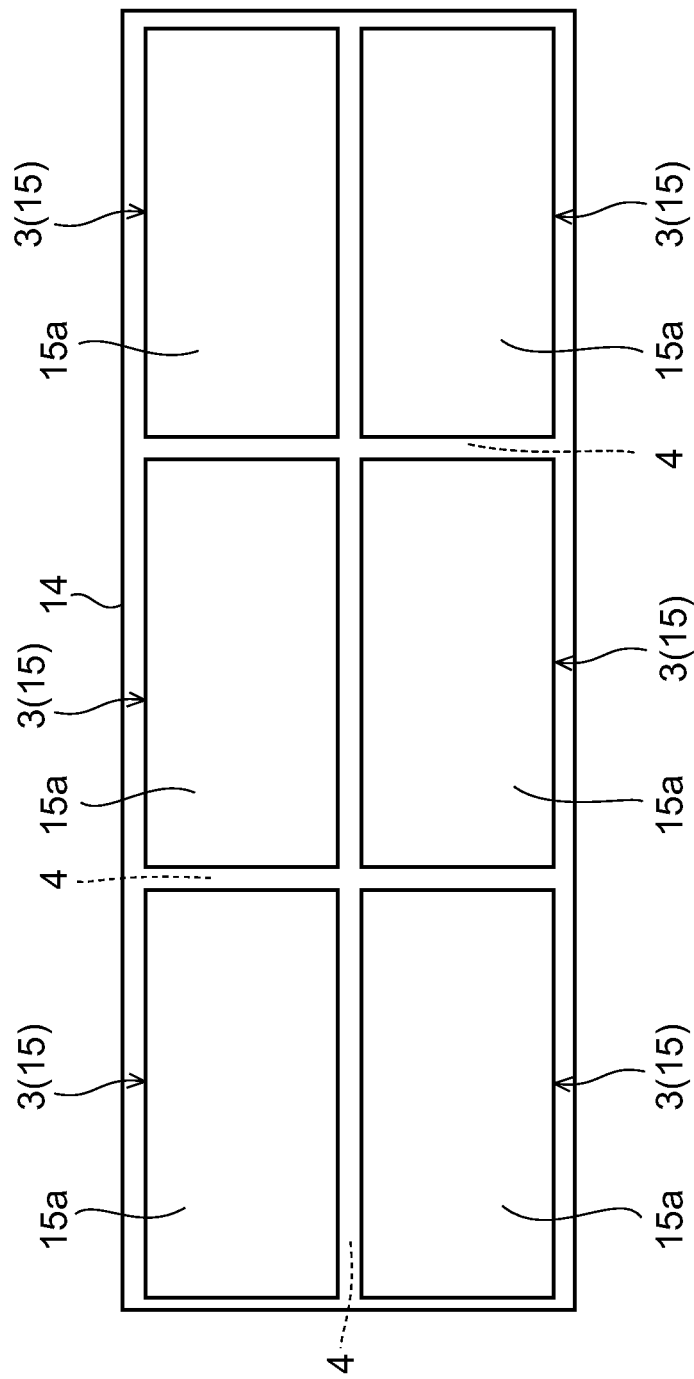
FIG. 18 to FIG. 22 are schematic plan views showing a method for manufacturing the light emitting device of the embodiment.

When the substrate 10 is removed, the first surface 15a of the semiconductor layer 15 is exposed as shown in FIG. 6A and FIG. 18 which corresponds to the top view of FIG. 6A. The first surface 15a is cleaned; and frosting is performed to form an unevenness if necessary. The light extraction efficiency may be increased by forming a micro unevenness in the first surface 15a.

Then, as shown in FIG. 6B, the p-side external terminal 23a and the n-side external terminal 24a are exposed by polishing the resin layer 25. Or, this process may be performed prior to the removal of the substrate 10.

Continuing as shown in FIG. 7A, the phosphor layer 30 is formed on the first surface 15a. The phosphor layer 30 includes a transparent resin and many phosphors having a powder or particle configuration dispersed in the transparent resin.

The liquid transparent resin into which the phosphors are dispersed is formed on the first surface 15a by, for example, a method such as imprinting, dispensing, screen printing, etc., to make the multiple gaps 41.

Figure 19:
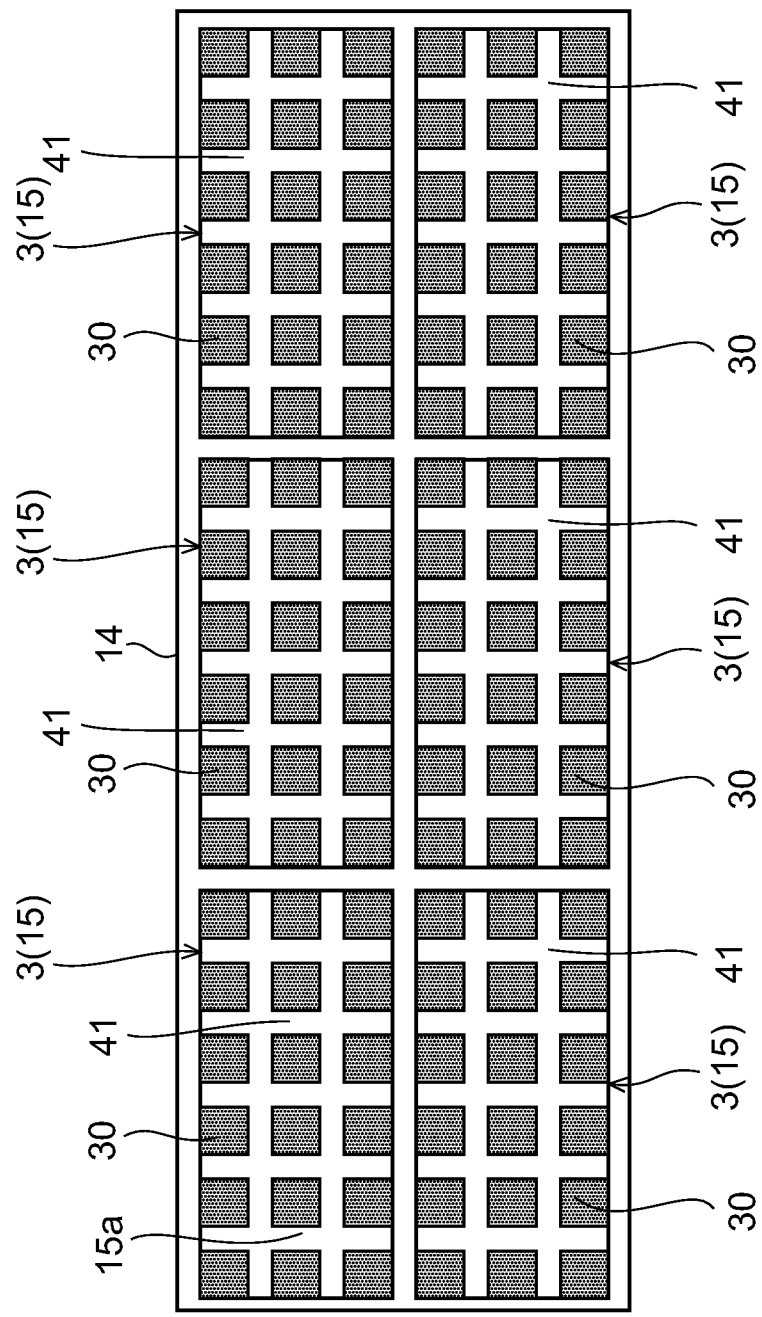
Figure 21:
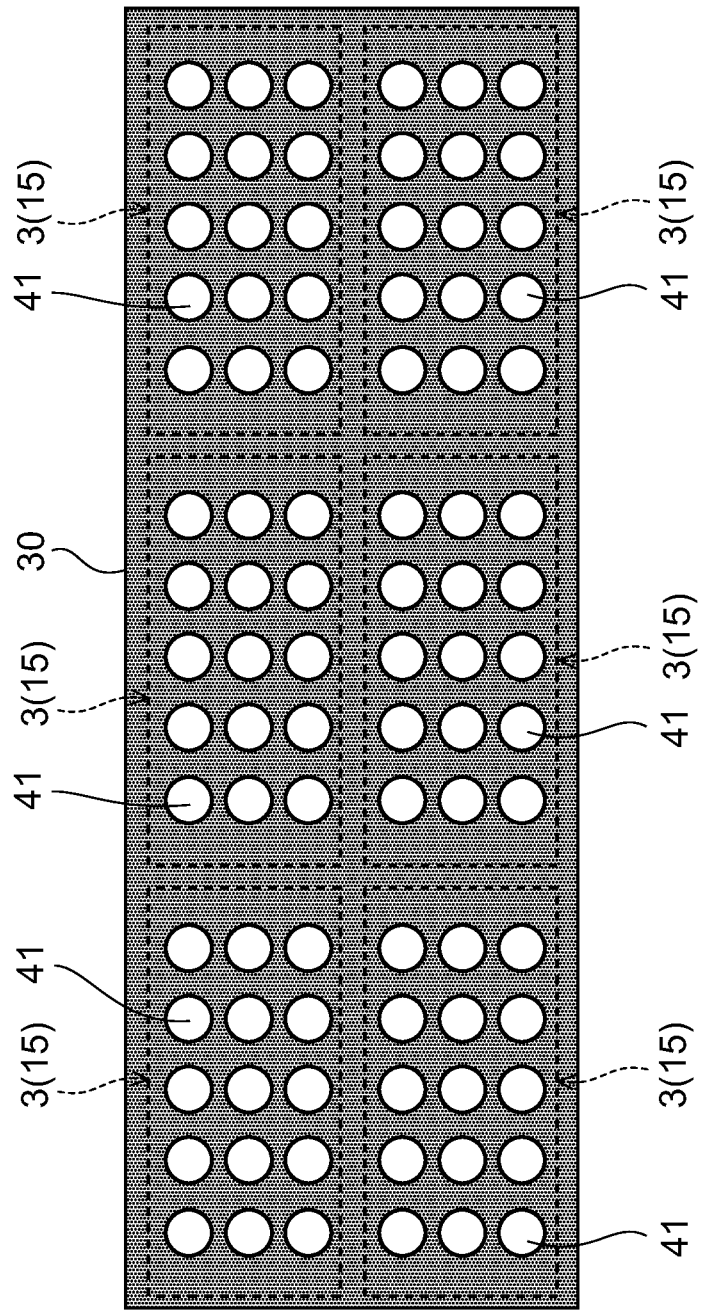

FIG. 19 and FIG. 21 correspond to the top view of FIG. 7A.

As shown in FIG. 19, the gaps 41 are formed in, for example, lattice trench configurations; and the phosphor layer 30 is separated into multiple pillar units. Or, as shown in FIG. 21, the gaps 41 are made as holes provided inside the phosphor layer 30.

The transparent resin of the phosphor layer 30 is, for example, a thermosetting resin and is caused to be in a half-cured state after being supplied onto the first surface 15a. At this stage, the size of the gap 41 is the same between all of the chips 3.

Then, as shown in FIG. 7B, a protective film 73 is adhered on the top surface of the phosphor layer 30.

Figure 8:
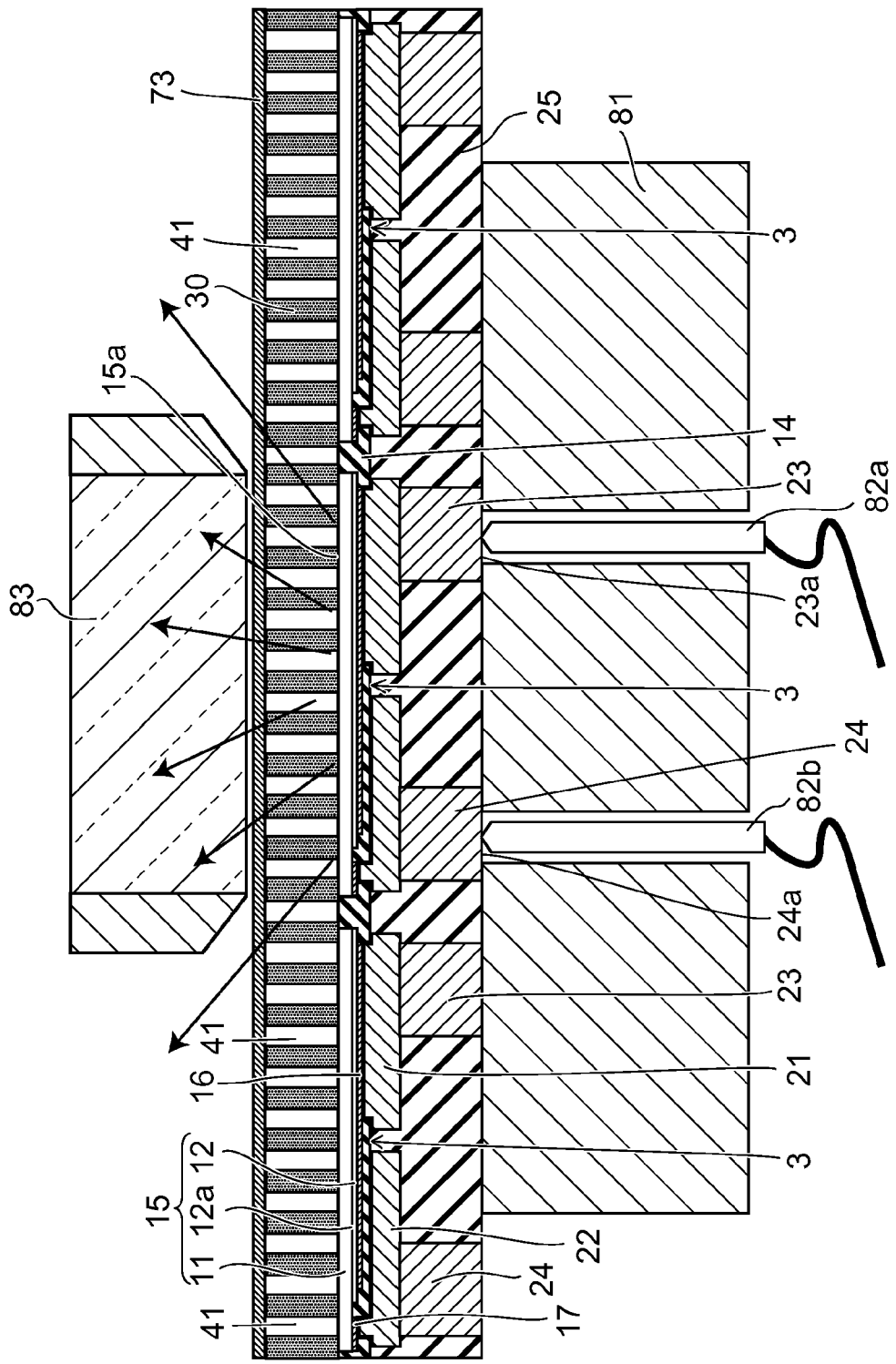

Continuing, an optical characteristic of each of the chips 3 is measured. Specifically, as shown in FIG. 8, the wafer is supported on a support platform 81. The surface of the wafer where the p-side external terminal 23a and the n-side external terminal 24a are exposed is supported on the flat surface of the support platform 81.

Through-portions for probes 82a and 82b are made in the support platform 81; and the probes 82a and 82b are caused to pass through the through-portions from the backside of the support platform 81. The probe 82a on the positive polarity side contacts the p-side external terminal 23a; and the probe 82b on the negative polarity side contacts the n-side external terminal 24a.

The light emitting layer 12a emits light by the current being supplied to the light emitting layer 12a of the chip 3 via the probes 82a and 82b. Then, for example, the light emission spectrum is measured as the optical characteristic of the light emitted from the first surface 15a. The chromaticity is obtained from the light emission spectrum.

The size of the gap 41 of the phosphor layer 30 is appropriately controlled according to the optical characteristic that is measured. Specifically, the size of the gap 41 is changed by pressurizing the phosphor layer 30 with a pressurizing tool 83.

Figure 9:
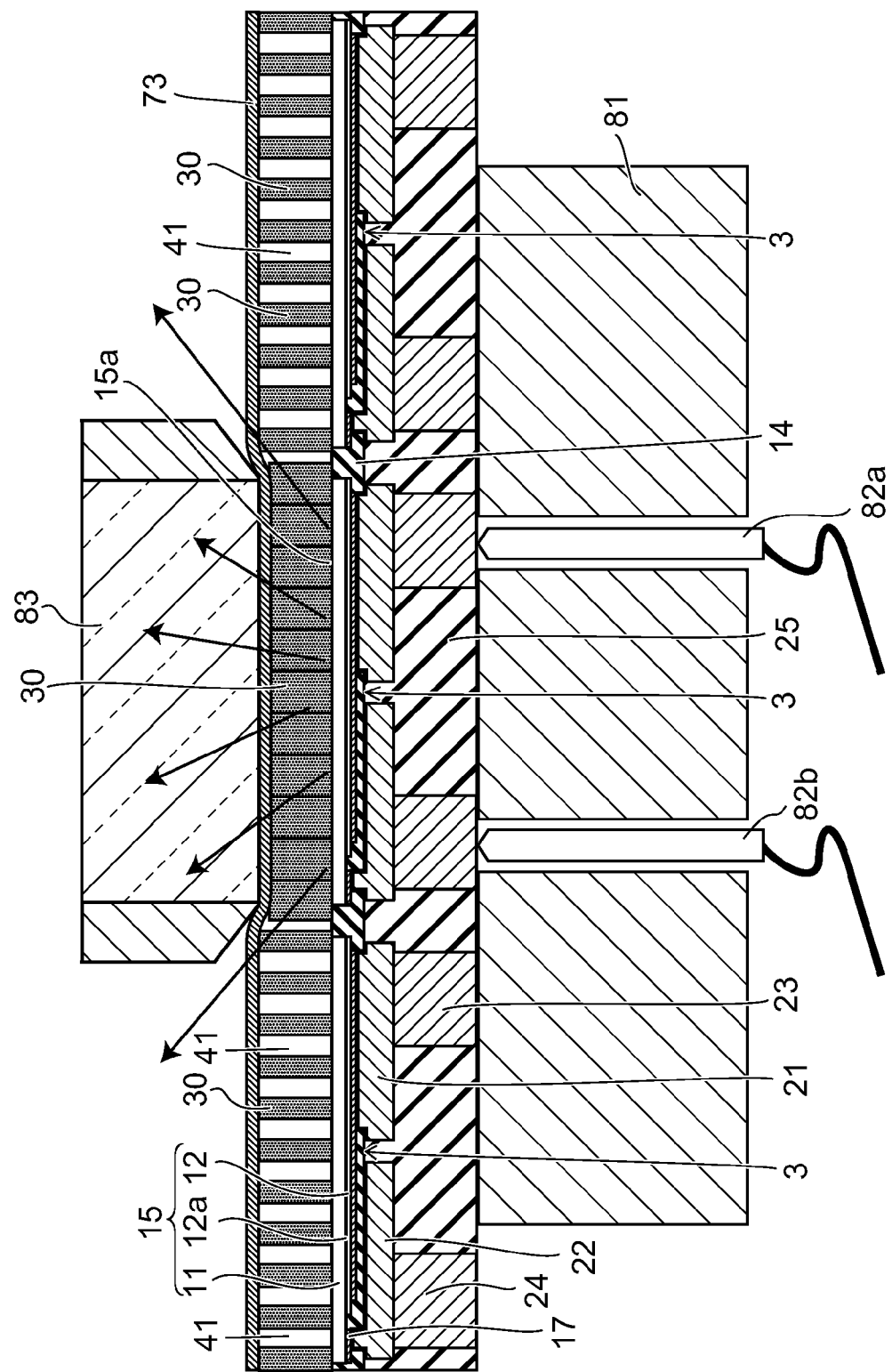

In the embodiment, for example, the phosphor layer 30 is pressurized while simultaneously causing the light emitting layer 12a to emit light and measuring the optical characteristic. As shown in FIG. 9, the phosphor layer 30 is mechanically pressed by the pressurizing tool 83 via the protective film 73.

The pressurizing tool 83 also serves as a light acquisition tool; and the light emitted from the first surface 15a side is guided into a not-shown measuring apparatus via the pressurizing tool 83 while pressing the phosphor layer 30 with the pressurizing tool 83. At least the pressurizing surface of the pressurizing tool 83 for the phosphor layer 30 is made of a material transparent to the light emitted by the light emitting layer 12a and the wavelength-converted light of the phosphor layer 30.

The protective film 73 does not obstruct the optical measurement because the protective film 73 is a transparent resin that is transparent to the light emitted by the light emitting layer 12a and the wavelength-converted light of the phosphor layer 30.

The protective film 73 suppresses the adhesion of the phosphor layer 30 to the pressurizing tool 83. Or, processing and/or surface treatment of the pressurizing tool 83 side may be performed such that the phosphor layer 30 does not easily adhere without providing the protective film 73.

The optical characteristic is measured while pressurizing the phosphor layer 30; and the pressurizing of the phosphor layer 30 is stopped when the desired chromaticity is read.

Or, the light characteristic measurement and the pressurizing of the phosphor layer 30 may not be simultaneous. The pressurizing of the phosphor layer 30 and the light acquisition are performed by separate tools; and after determining the pressurizing amount (the size adjustment amount of the gap 41) of the phosphor layer 30 according to the optical characteristic that is measured and pressurizing the phosphor layer 30, the light characteristic measurement is performed again.

Figure 10:
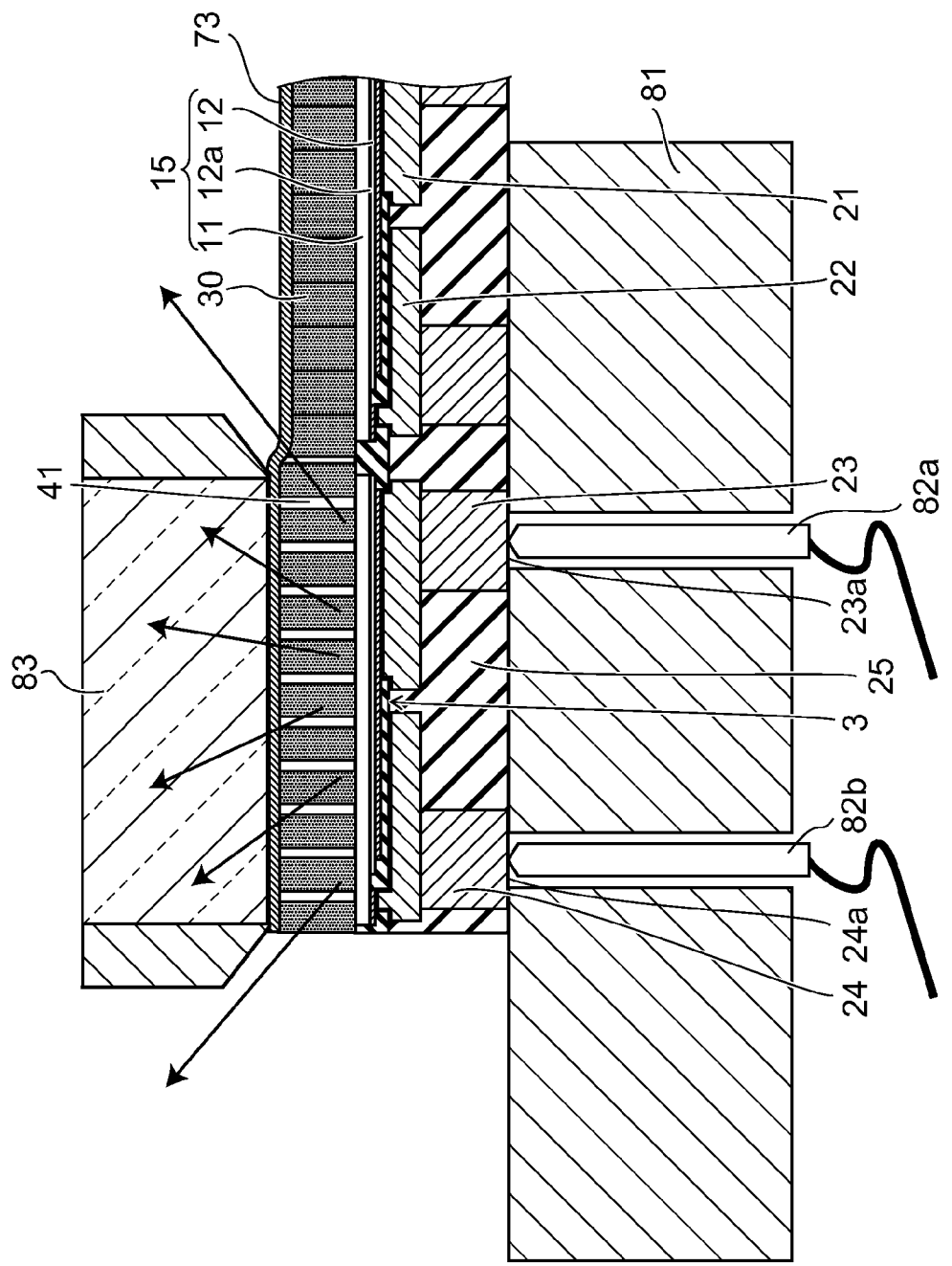

When the light characteristic measurement and the gap adjustment for one of the chips 3 ends, a similar light characteristic measurement and a similar gap adjustment are performed for one other chip 3 as shown in FIG. 10. For example, the light characteristic measurement and the gap adjustment are performed for all of the chips 3 in the wafer by a step-and-repeat method.

Or, the light characteristic measurement may be performed only for selected chips 3 without being limited to all of the chips 3 in the wafer; the distribution of the optical characteristic in the wafer may be acquired; and the gap adjustment may be performed based on the distribution. The optical characteristic and the pressurizing of the phosphor layer 30 are not limited to being for the one of the chips 3 and may be performed for multiple chips 3.

In the pressurizing process recited above, for example, the thermosetting resin of the phosphor layer 30 deforms by receiving the pressure of the pressurizing tool 83 in a half-cured state. Subsequently, the gaps 41 are maintained at the desired size (including the size being zero) by performing the main curing of the thermosetting resin by heating the phosphor layer 30.

Subsequently, the protective film 73 is peeled as shown in FIG. 11A. Then, as shown in FIG. 11B, for example, the transparent resin 51 is filled into the gaps 41 as a second transparent body that is transparent to the light emitted by the light emitting layer 12a and the wavelength-converted light of the phosphor layer 30. The transparent resin 51 is provided also on the phosphor layer 30 to cover the phosphor layer 30. It is also possible to increase the light extraction efficiency by performing unevenness processing of the top surface of the transparent resin 51.

For example, the transparent resin 51 is thermally cured as the second transparent body after being supplied into the gaps 41 and onto the phosphor layer 30 in the liquid state by, for example, spin coating, vacuum printing, molding, etc.

The second transparent body may be filled only into the gaps 41 and may not be provided on the phosphor layer 30. Foreign objects can be prevented from entering the gaps 41 by the second transparent body being filled into the gaps 41. The main curing of the phosphor layer 30 may be performed after forming the second transparent body.

It is favorable for a material having a refractive index that is lower than that of the transparent body of the phosphor layer 30 to be used as the second transparent body. Because the difference of the extraction path of the light due to the existence/absence of the second transparent body decreases in such a case, it is easier to control the optical characteristic of the final product after the second transparent body is filled by using the optical characteristic prior to filling the second transparent body.

Then, singulation into multiple semiconductor light emitting devices (the three semiconductor light emitting devices 1a to 1c are shown in FIG. 1) is performed as shown in FIG. 1 by cutting the transparent resin 51, the phosphor layer 30, the insulating layer 14, and the resin layer 25 at the position of the trench 4.

The semiconductor layer 15 is not formed in the trench 4; and in the embodiment, the insulating layer 14 which is a resin is filled into the trench 4. The resin layer 25 is provided under the insulating layer 14. Accordingly, the semiconductor layer 15 is not provided in the dicing region; and a resin that is softer than the semiconductor layer 15 is provided in the dicing region. Therefore, damage to the semiconductor layer 15 can be avoided when dicing.

Each of the processes described above until the dicing is performed collectively in the wafer state. Accordingly, it is unnecessary to form the support body and protect the chip with an insulator for each individual semiconductor light emitting device after the dicing; and it becomes possible to drastically reduce the production costs. The side surface of the semiconductor layer 15 is already protected by being covered with the insulating layer 14 in the singulated state shown in FIG. 1.

The semiconductor light emitting device that is singulated may have a single-chip structure including one of the chips 3 or may have a multi-chip structure including multiple chips 3.

Even for the chips 3 in the same wafer, there are cases where the wavelength of the light emitted from the first surface 15a fluctuates. In the case where the peak wavelength of the excitation light emitted from the first surface 15a shifts, the wavelength conversion efficiency of the phosphor layer 30 or the light emission intensity of the phosphor layer 30 changes; and as a result, the chromaticity of the light emitted to the outside may be caused to fluctuate.

Conversely, according to the embodiment, the phosphor layer 30 is pre-formed in the state in which the multiple gaps 41 are made; and the size of the gap 41 is controlled by pressurizing the phosphor layer 30 on the chip 3 according to the light emission characteristic of the chip 3.

When the phosphor layer 30 is pressed from the top surface side of the phosphor layer 30, the height of the phosphor layer 30 decreases; the dimension of the gap 41 in the height direction decreases; the width of the phosphor layer 30 increases; and the width of the gap 41 decreases.

In other words, the size (the volume) of the gap 41 decreases as the pressurizing amount on the phosphor layer 30 increases. The proportion of the wavelength-converted light from the phosphor layer 30 relatively decreases and there is a tendency for the mixed light to be of a wavelength near the light emission color (e.g., blue) of the light emitting layer 12a of the chip 3 as the size of the gap 41 not including the phosphor increases.

Accordingly, by appropriately adjusting the size of the gap 41 (including the size being zero) between the chips 3, the chromaticity fluctuation in the wafer can be suppressed; and the singulated individual semiconductor light emitting devices may have the desired chromaticity.

According to the optical characteristic that is measured, there are cases where the size of the gap 41 is not changed from when the phosphor layer 30 shown in FIG. 7A is formed. Also, according to the optical characteristic that is measured, there are cases where the gap is eliminated as shown in the semiconductor light emitting device 1b in the middle of FIG. 1.

Figure 12A:
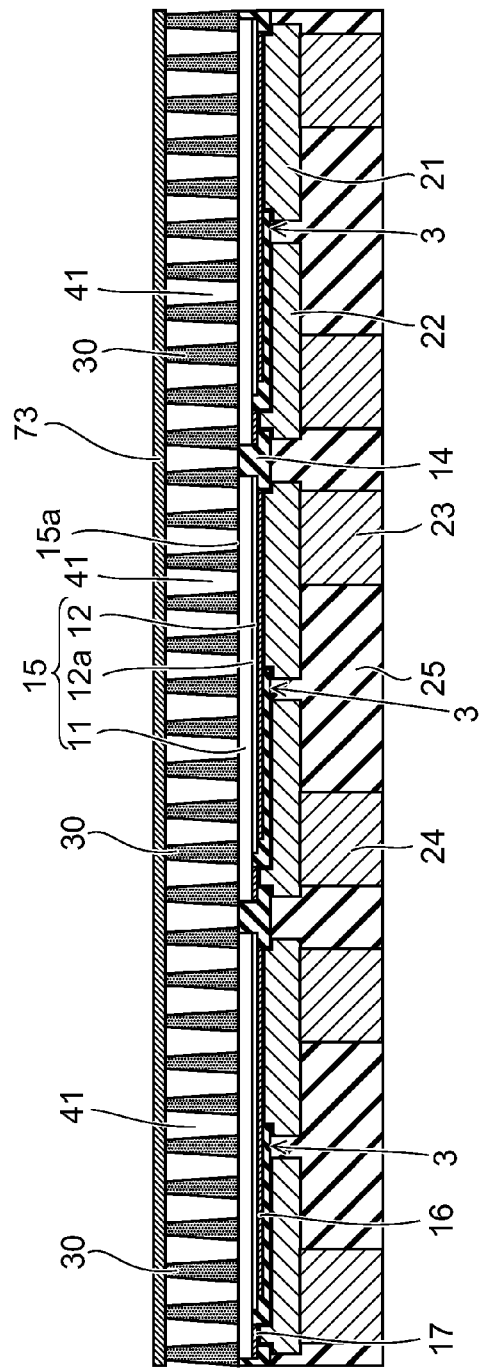
FIGS. 12A and 12B are schematic cross-sectional views showing another method for manufacturing the light emitting device of the first embodiment.
Figure 12B:
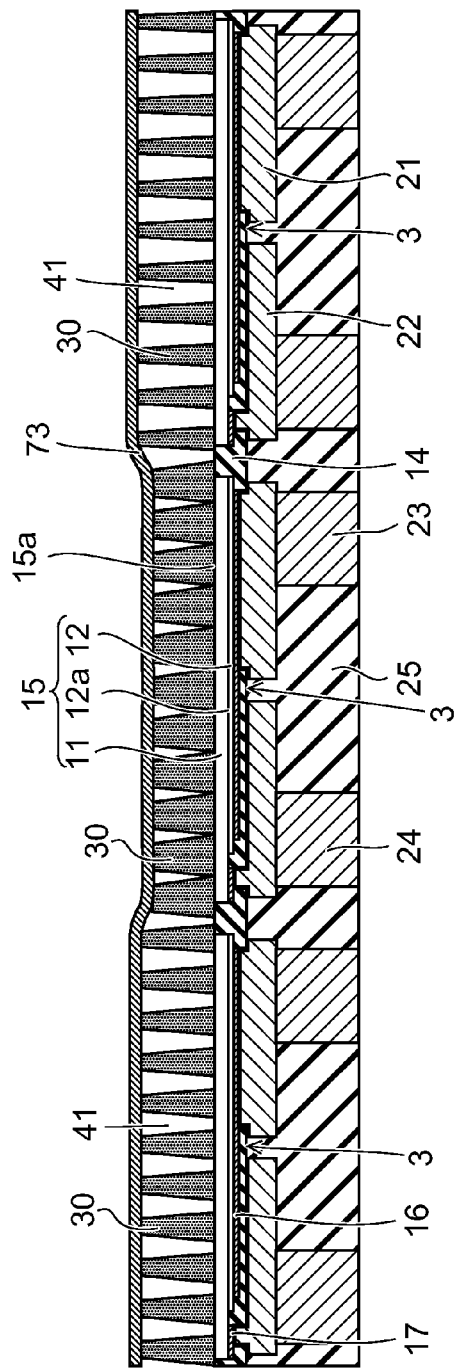

FIGS. 12A and 12B show a modification of the process corresponding to the process shown in FIG. 7B and FIG. 9, respectively.

In the modification, the side surfaces of the gaps 41 have tapers. In other words, the width of the upper portion of the gap 41 on the upper end side of the phosphor layer 30 is wider than the width of the bottom portion of the gap 41 on the lower end side of the phosphor layer 30. Thereby, for example, the release of the template is easy in the case where the gaps 41 are made in the phosphor layer 30 by imprinting. Moreover, voids are not easily trapped when the phosphor layer 30 is pressed.

Second Embodiment

Figure 13:
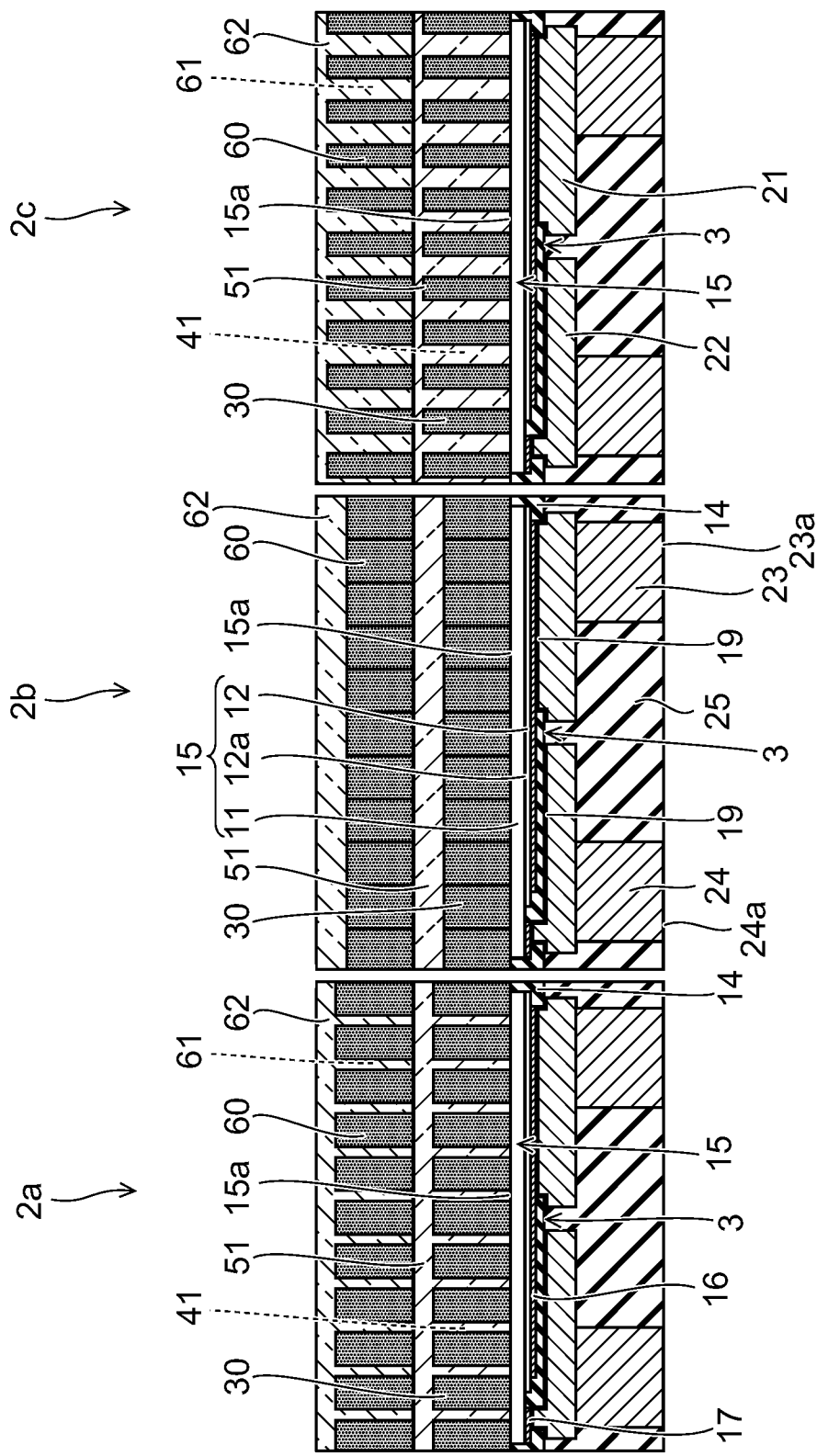
FIG. 13 is a schematic cross-sectional view of a semiconductor light emitting device of a second embodiment.

FIG. 13 is a schematic cross-sectional view of semiconductor light emitting devices of a second embodiment.

For example, the three semiconductor light emitting devices 2a to 2c that are singulated from the wafer state are shown in FIG. 13. The components included in each of the three semiconductor light emitting devices 2a to 2c are collectively formed in the wafer state prior to the singulation as described below.

Similarly to the first embodiment, each of the semiconductor light emitting devices 2a to 2c includes the chip 3 and the first phosphor layer 30 provided on the chip 3. The semiconductor light emitting devices 2a to 2c of the second embodiment differ from those of the first embodiment in that a second phosphor layer 60 is included.

The second phosphor layer 60 is provided on the transparent resin 51. The second phosphor layer 60 includes multiple phosphors having a powder or particle configuration that are capable of absorbing the emitted light (the excitation light) of the light emitting layer 12a and emitting a wavelength-converted light. The phosphors are dispersed in, for example, a transparent resin used as a transparent body that is transparent to the light emitted by the light emitting layer 12a and the emitted light (the wavelength-converted light) of the phosphors.

The phosphors of the first phosphor layer 30 are red phosphors that receive the excitation light from the chip 3 and emit red light. The phosphors of the second phosphor layer 60 are green phosphors that receive the excitation light from the chip 3 and emit green light.

Accordingly, in the second embodiment, white, lamp, etc., can be obtained as a mixed color of the blue light from the light emitting layer 12a which is the GaN-based material, the red light which is the wavelength-converted light of the first phosphor layer 30, and the green light which is the wavelength-converted light of the second phosphor layer 60.

By using the red phosphors and the green phosphors as the phosphors, color rendering characteristics that are obtained are better than those of the case where the yellow phosphors are used. Moreover, because the green phosphors are not excited by the red light, the green phosphors can be excited by only the blue light which is the excitation light passing through the first phosphor layer 30 which is the red phosphor layer.

In the case of stacking that is the reverse of the second embodiment, that is, in the case where the green phosphor layer is provided on the chip 3 side and the red phosphor layer is provided on the green phosphor layer, the red phosphors are undesirably excited by the green light emitted from the green phosphor layer on the bottom. In such a case, the luminous efficiency of the red undesirably is lower than the case of being excited by the blue light.

Of the three semiconductor light emitting devices 2a to 2c shown in FIG. 13, for example, multiple gaps 61 are made in the second phosphor layer 60 for the semiconductor light emitting device 2a and the semiconductor light emitting device 2c. The gaps 61 do not include the phosphors; and, for example, a transparent resin 62 is filled into the gaps 61 as a transparent body that is transparent to the light emitted by the light emitting layer 12a and the emitted light (the wavelength-converted light) of the phosphors. For example, the gap is not made in the second phosphor layer 60 of the semiconductor light emitting device 2b shown in the middle of FIG. 13.

Similarly to the gaps 41 made in the first phosphor layer 30, the gaps 61 are made as lattice trenches and/or holes.

For the second phosphor layer 60 as well, the chromaticity of the mixed light emitted outside the semiconductor light emitting device can be controlled by appropriately adjusting the size (including the size being zero) of the gap 61 between the chips 3.

In the individual semiconductor light emitting device, the size of the gap 41 of the first phosphor layer 30 is not limited to being the same as the size of the gap 61 of the second phosphor layer 60; and the size of the gap is controllable independently between the first phosphor layer 30 and the second phosphor layer 60 according to the light emission characteristic of the chip 3 that is measured.

A method for manufacturing the semiconductor light emitting device of the second embodiment will now be described with reference to FIG. 14 to FIG. 17.

Figure 14:
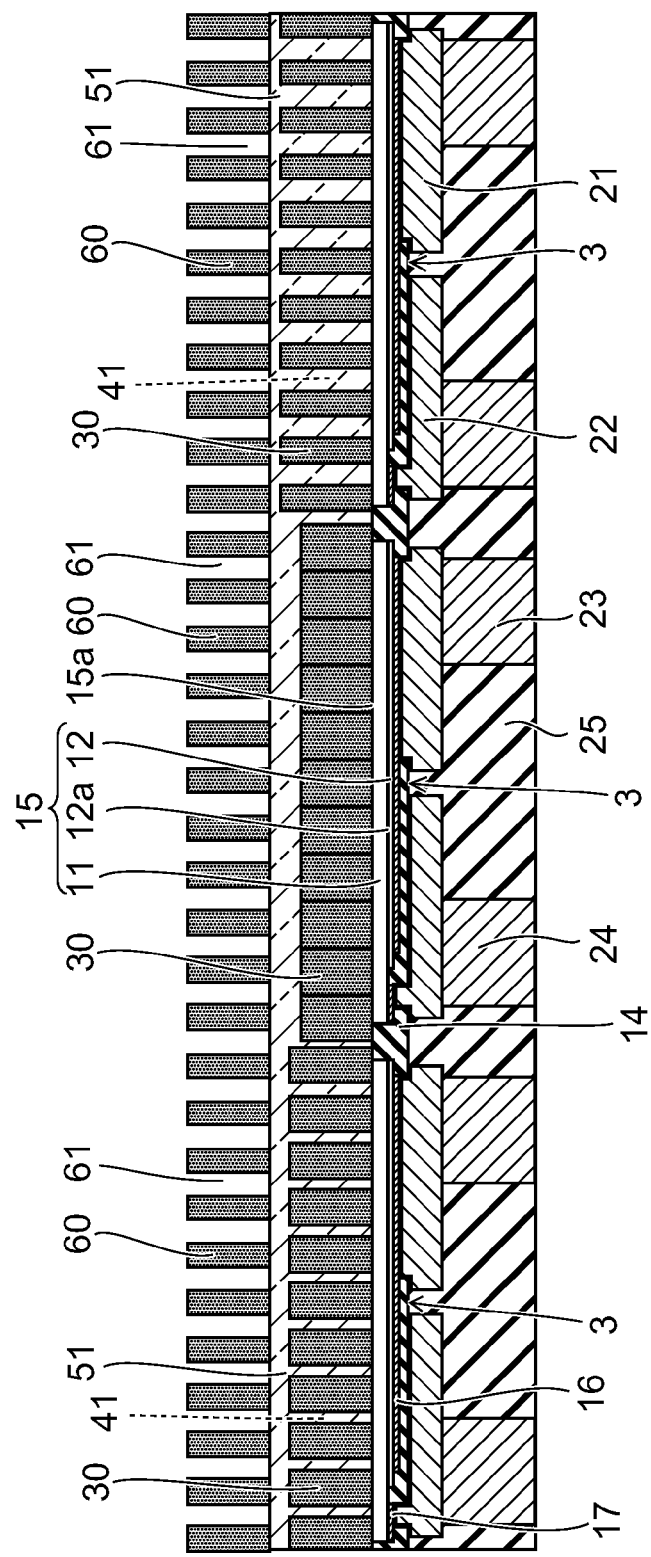
FIG. 14 to FIG. 17 are schematic cross-sectional views showing a method for manufacturing the light emitting device of the second embodiment.

The processes up to the formation of the transparent resin 51 progress similarly to those of the first embodiment. Subsequently, as shown in FIG. 14, the second phosphor layer 60 is formed on the top surface (the flat surface) of the transparent resin 51. The second phosphor layer 60 includes a transparent resin and many phosphors having a powder or particle configuration dispersed in the transparent resin.

The liquid transparent resin into which the phosphors are dispersed is formed on the transparent resin 51 by, for example, a method such as imprinting, dispensing, screen printing, etc., to make the multiple gaps 61.

The transparent resin of the second phosphor layer 60 is, for example, a thermosetting resin and is caused to be in a half-cured state after being supplied onto the transparent resin 51. At this stage, the size of the gap 61 is the same between all of the chips 3.

Figure 15:
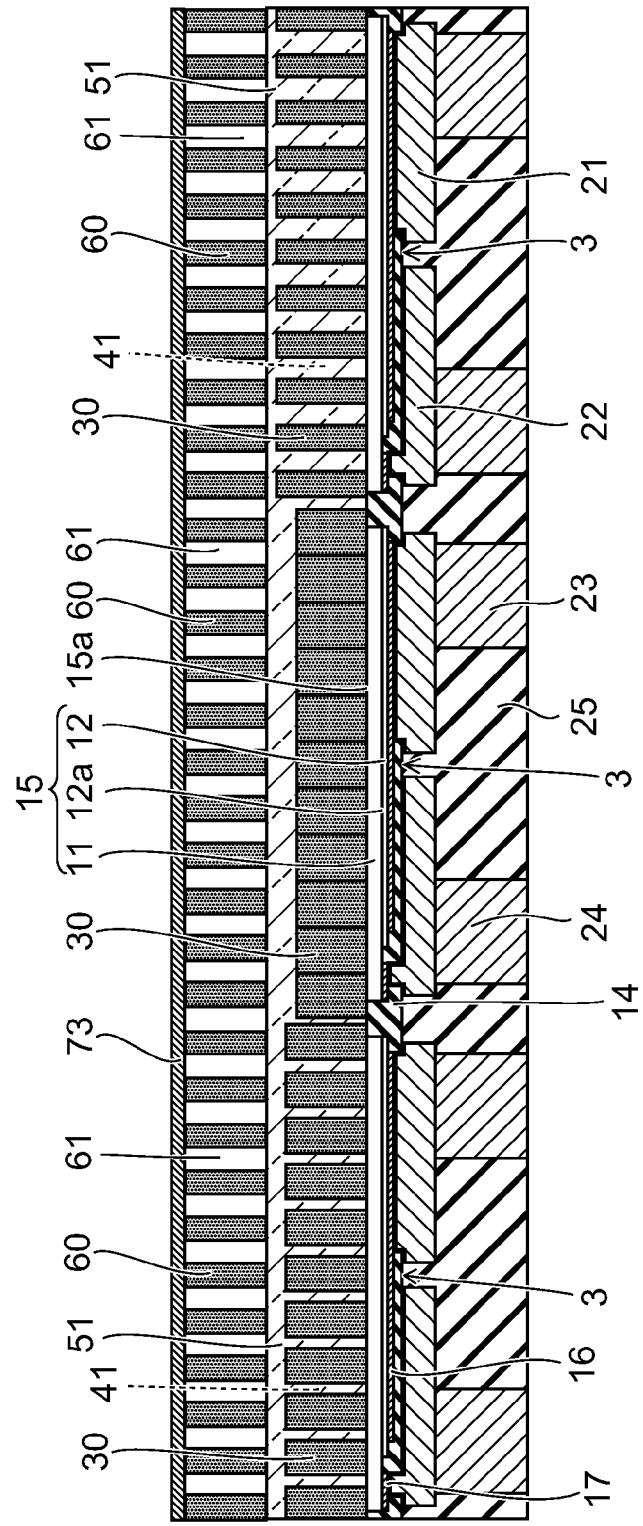

Then, as shown in FIG. 15, the protective film 73 is adhered on the top surface of the second phosphor layer 60.

Continuing, similarly to the first embodiment, the optical characteristic is measured for each of the chips 3. Namely, the current is supplied to the light emitting layer 12a of the chip 3 via the probes 82a and 82b shown in FIG. 8; and the light emitting layer 12a emits light. For example, the light emission spectrum is measured as the optical characteristic of the light passing through the protective film 73. The chromaticity is obtained from the light emission spectrum.

The size of the gap 61 of the second phosphor layer 60 is appropriately controlled according to the optical characteristic that is measured. Similarly to the first embodiment, the size of the gap 61 is changed by pressurizing the second phosphor layer 60 with the pressurizing tool 83.

Figure 16:
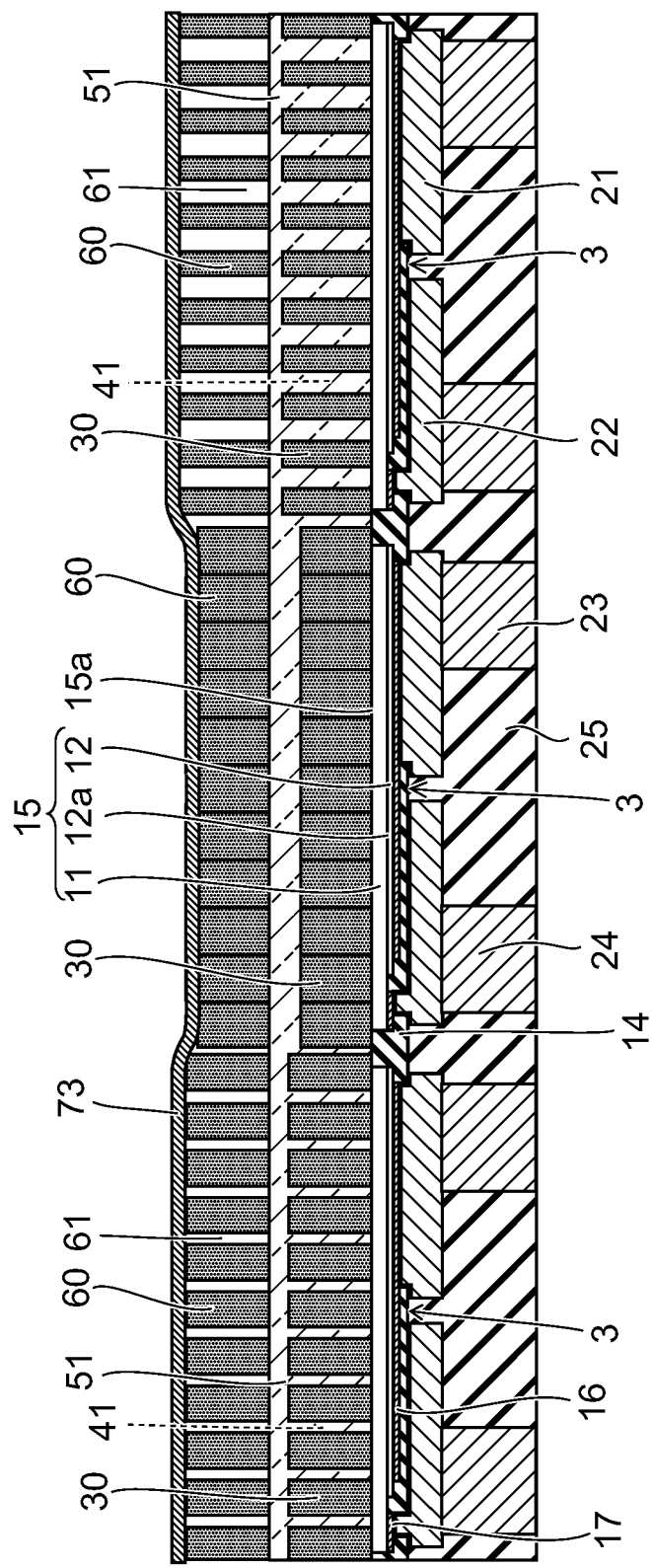

The second phosphor layer 60 is mechanically pressed by the pressurizing tool 83 described above via the protective film 73. For example, FIG. 16 shows the state in which the second phosphor layer 60 on the chip 3 in the middle is pressed.

The optical characteristic is measured while pressurizing the second phosphor layer 60; and the pressurizing of the second phosphor layer 60 is stopped when the desired chromaticity is read.

Or, the pressurizing of the second phosphor layer 60 and the light acquisition are performed by separate tools; and after determining the pressurizing amount (the size adjustment amount of the gap 61) of the second phosphor layer 60 according to the optical characteristic that is measured and pressurizing the second phosphor layer 60, the light characteristic measurement is performed again.

For example, the light characteristic measurement and the adjustment of the gaps 61 are performed for all of the chips 3 in the wafer by a step-and-repeat method. Or, the light characteristic measurement may be performed only for selected chips 3 without being limited to all of the chips 3 in the wafer; the distribution of the optical characteristic in the wafer may be acquired; and the adjustment of the gaps 61 may be performed based on the distribution. The light characteristic measurement and the pressurizing of the second phosphor layer 60 are not limited to being for the one of the chips 3 and may be performed for multiple chips 3.

For example, the thermosetting resin of the second phosphor layer 60 deforms by receiving the pressure of the pressurizing tool 83 in a half-cured state. Subsequently, the gaps 61 are maintained at the desired size (including the size being zero) by performing the main curing of the thermosetting resin by heating the second phosphor layer 60.

Figure 17:
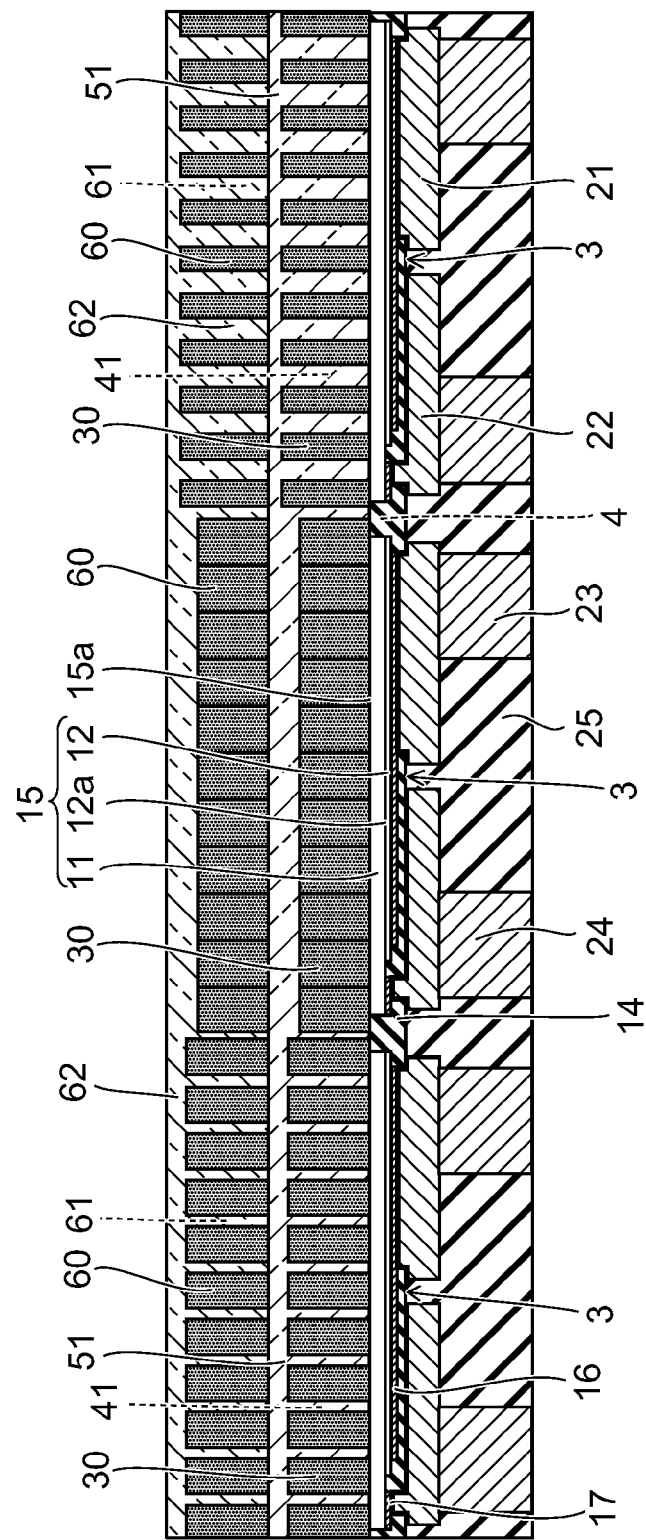

Subsequently, after peeling the protective film 73, for example, the transparent resin 62 is filled into the gaps 61 as a second transparent body that is transparent to the light emitted by the light emitting layer 12a and the wavelength-converted light of the phosphor layer 30 as shown in FIG. 17. The transparent resin 62 is provided also on the second phosphor layer 60 to cover the second phosphor layer 60. It is also possible to increase the light extraction efficiency by performing unevenness processing of the top surface of the transparent resin 62.

For example, the transparent resin 62 is thermally cured as the second transparent body after being supplied into the gaps 61 and onto the second phosphor layer 60 in the liquid state by, for example, spin coating, vacuum printing, molding, etc.

The second transparent body may be filled only into the gaps 61 and may not be provided on the second phosphor layer 60. Foreign objects can be prevented from entering the gaps 61 by the second transparent body being filled into the gaps 61.

It is favorable for a material having a refractive index that is lower than that of the transparent body of the phosphor layer 60 to be used as the second transparent body. Because the difference of the extraction path of the light due to the existence/absence of the second transparent body decreases in such a case, it is easier to control the optical characteristic of the final product after the second transparent body is filled by using the optical characteristic prior to filling the second transparent body.

Then, singulation into multiple semiconductor light emitting devices (the three semiconductor light emitting devices 2a to 2c are shown in FIG. 13) is performed as shown in FIG. 13 by cutting the transparent resin 62, the second phosphor layer 60, the transparent resin 51, the first phosphor layer 30, the insulating layer 14, and the resin layer 25 at the position of the trench 4.

In the second embodiment as well, each of the processes described above until the dicing is performed collectively in the wafer state. Accordingly, it is unnecessary to form the support body and protect the chip with an insulator for each individual semiconductor light emitting device after the dicing; and it becomes possible to drastically reduce the production costs. The side surface of the semiconductor layer 15 is already protected by being covered with the insulating layer 14 in the singulated state shown in FIG. 13.

According to the second embodiment, the size (the volume) of the gap 61 decreases as the pressurizing amount on the second phosphor layer 60 increases. The proportion of the wavelength-converted light from the second phosphor layer 60 relatively decreases as the size of the gap 61 not including the phosphor increases. Accordingly, the singulated individual semiconductor light emitting devices may have the desired chromaticity by appropriately adjusting the size (including the size being zero) of the gap 61.

In the second embodiment, the size adjustment of the gap in which the phosphor layer is formed to make the gaps and the phosphor layer is pressed may be performed for only one selected from the first phosphor layer 30 and the second phosphor layer 60.

The transparent body of the phosphor layer is not limited to a resin; and glass may be used. The contraction during the curing can be suppressed more when a resin not including a solvent is used as the transparent body than when spin-on glass is used. Therefore, when the main curing of the phosphor layer is performed, the fluctuation of the size of the gap that is already adjusted is suppressed; and it is easy to improve the controllability to have the desired chromaticity.

Also, the second transparent body (which is transparent to the light emitted by the light emitting layer and the wavelength-converted light of the phosphor layer) filled into the gaps of the phosphor layer is not limited to being a resin; and glass may be used. The contraction during the curing can be suppressed more when a resin not including a solvent is used as the second transparent body than when spin-on glass is used. Therefore, the deformation in the main curing can be suppressed; and it is easy to improve the controllability to have the desired chromaticity.

The red phosphor layer, the yellow phosphor layer, the green phosphor layer, and the blue phosphor layer illustrated below may be used as the phosphor layer.

The red phosphor layer may contain, for example, a nitride-based phosphor of $CaAlSiN_3$:Eu and/or a sialon-based phosphor.

In particular, in the case where a sialon-based phosphor is used, $$(M_{1-x}R_x)_{a1}AlSi_{b1}O_{c1}N_{d1} \qquad \text{Compositional Formula (1)}$$

may be used (where M is at least one type of metal element excluding Si and Al, and it is particularly desirable for M to be at least one selected from Ca and Sr; R is a light emission center element, and it is particularly desirable for R to be Eu; and x, a1, b1, c1, and d1 satisfy the following relationships: $0<x\leq1$, $0.6<a1<0.95$, $2<b1<3.9$, $0.25<c1<0.45$, and $4<d1<5.7$).

By using the sialon-based phosphor of Compositional Formula (1), the temperature characteristics of the wavelength conversion efficiency can be improved; and the efficiency in the high current density region can be increased further.

The yellow phosphor layer may contain, for example, a silicate-based phosphor of $(Sr, Ca, Ba)_2SiO_4$:Eu.

The green phosphor layer may contain, for example, a halophosphate-based phosphor of $(Ba, Ca, Mg)_{10}(PO_4)_6.Cl_2$:Eu or a sialon-based phosphor.

In particular, in the case where a sialon-based phosphor is used,

 Compositional Formula (2)

may be used (where M is at least one type of metal element excluding Si and Al, and it is particularly desirable for M to be at least one selected from Ca and Sr; R is a light emission center element, and it is particularly desirable for R to be Eu; and x, a2, b2, c2, and d2 satisfy the following relationships: $0<x\leq1$, $0.93<a2<1.3$, $4.0<b2<5.8$, $0.6<c2<1$, and $6<d2<11$).

By using the sialon-based phosphor of Compositional Formula (2), the temperature characteristics of the wavelength conversion efficiency can be improved; and the efficiency in the high current density region can be increased further.

The blue phosphor layer may contain, for example, an oxide-based phosphor of $BaMgAl_{10}O_{17}$:Eu.

According to an embodiment, the transparent body of the phosphor layer is a transparent resin.

According to an embodiment, the gaps of the phosphor layer are trenches that separate the phosphor layer into multiple pillar units. Or, the gaps of the phosphor layer are holes provided in the phosphor layer.

According to an embodiment, the phosphor layer includes a transparent body and a phosphor dispersed in the transparent body; and the transparent body deforms by pressurizing.

According to an embodiment, the transparent body is a thermosetting resin; and the thermosetting resin is cured after the thermosetting resin is caused to deform by pressing with a pressurizing tool in a half-cured state.

The embodiment includes a process of causing the light emitting layer to emit light and measuring the optical characteristic of the light emitted from the first surface; and the pressurizing amount of the phosphor layer is controlled according to the optical characteristic.

According to an embodiment, the phosphor layer is pressurized while simultaneously measuring the optical characteristic.

According to an embodiment, the light is guided to a measuring apparatus via the pressurizing tool while pressing the phosphor layer with the pressurizing tool.

According to an embodiment, the phosphor layer is pressed by the pressurizing tool via a protective film that is adhered to the top surface of the phosphor layer and transparent to the light.

According to an embodiment, the p-side external terminal electrically connected to the p-side electrode and the n-side external terminal electrically connected to the n-side electrode are exposed on the second surface side; probes are caused to contact the p-side external terminal and the n-side external terminal; the light emitting layer is caused to emit light by supplying a current to the light emitting layer; and the optical characteristic is measured.

According to an embodiment, the width of the upper portion of the gap of the phosphor layer on the upper end side of the phosphor layer is wider than the width of the bottom portion of the gap on the lower end side of the phosphor layer.

According to an embodiment, the embodiment includes a process of filling a second transparent body into the gaps of the phosphor layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor light emitting device, comprising:
a plurality of chips, wherein each of the plurality of chips includes a semiconductor layer, a p-side electrode, and an n-side electrode, wherein the semiconductor layer has a first surface, a second surface opposite to the first surface, and a light emitting layer, and wherein the p-side electrode is provided in an emitting region on the semiconductor layer, and the n-side electrode is provided in a non-emitting region on the semiconductor layer;
a phosphor layer provided on a side of the first surface of the semiconductor layer of each of the plurality of chips, wherein the phosphor layer includes a first transparent body, a phosphor dispersed in the first transparent body, and a gap which does not include the phosphor, wherein the gap seperates a top face of the phosphor layer; and
a transparent resin provided in the gap.

2. The device according to claim 1, wherein a refractive index of the transparent resin is lower than a refractive index of the first transparent body of the phosphor layer.

3. The device according to claim 1, wherein the gap in the phosphor layer is a trench which separates the phosphor layer into a plurality of pillar units.

4. The device according to claim 3, wherein the gap in the phosphor layer is formed in a lattice trench configuration.

5. The device according to claim 1, wherein the gap includes a plurality of holes provided in the phosphor layer.

6. The device according to claim 5, wherein each of the plurality of holes provided in the phosphor layer is formed in a circle configuration.

7. The device according to claim 1, wherein the gap in the phosphor layer in each of the plurality of chips has a different size.

8. The device according to claim 1, wherein the first transparent body of the phosphor layer has tapered side surfaces such that a width of an upper portion of the first transparent body of the phosphor layer is narrower than a width of a bottom portion of the first transparent body of the phosphor layer.

9. The device according to claim 1, further comprising another phosphor layer which is provided on the phosphor layer,
wherein the transparent resin is also provided between said another phosphor layer and the phosphor layer, and wherein a phosphor included in said another phosphor layer is different from the phosphor included in the phosphor layer.

10. The device according to claim 1, wherein each of the plurality of chips includes an insulating layer provided on a side of the second surface of the semiconductor layer and on a side surface of the semiconductor layer.

11. A semiconductor light emitting device, comprising:
a chip including a semiconductor layer, a p-side electrode, and an n-side electrode, wherein the semiconductor layer has a first surface, a second surface opposite to the first surface, and a light emitting layer, and wherein the p-side electrode is provided in an emitting region on the semiconductor layer, and the n-side electrode is provided in a non-emitting region on the semiconductor layer;
a phosphor layer provided on a side of the first surface of the semiconductor layer of the chip, wherein the phosphor layer includes a first transparent body, a phosphor dispersed in the first transparent body, and a gap which does not include the phosphor, wherein the gap seperates a top face of the phosphor layer; and a transparent resin provided in the gap.

12. The device according to claim 11, wherein a refractive index of the transparent resin is lower than a refractive index of the first transparent body of the phosphor layer.

13. The device according to claim 11, wherein the gap in the phosphor layer is a trench which separates the phosphor layer into a plurality of pillar units.

14. The device according to claim 13, wherein the gap in the phosphor layer is formed in a lattice trench configuration.

15. The device according to claim 11, wherein the gap includes a plurality of holes provided in the phosphor layer.

16. The device according to claim 15, wherein each of the plurality of holes provided in the phosphor layer is formed in a circle configuration.

17. The device according to claim 11, further comprising another phosphor layer which is provided on the phosphor layer, wherein the transparent resin is also provided between said another phosphor layer and the phosphor layer, and wherein a phosphor included in said another phosphor layer is different from the phosphor included in the phosphor layer.

18. The device according to claim 11, wherein the chip includes an insulating layer provided on a side of the second surface of the semiconductor layer and on a side surface of the semiconductor layer.

19. A method for manufacturing a semiconductor light emitting device, comprising:

forming a phosphor layer on a side of a first surface of a semiconductor layer of each of a plurality of chips, wherein each of the plurality of chips includes the semiconductor layer, a p-side electrode, and an n-side electrode, wherein the semiconductor layer has the first surface, a second surface opposite to the first surface, and a light emitting layer, and wherein the p-side electrode is provided in an emitting region on the semiconductor layer, and the n-side electrode is provided in a non-emitting region on the semiconductor layer, wherein the phosphor layer has a gap which does not include a phosphor; and narrowing a size of the gap in the phosphor layer of at least one of the plurality of chips by pressurizing the phosphor layer of said at least one of the plurality of chips.

20. The method according to claim 19, wherein the phosphor layer includes a first transparent body, wherein the phosphor is dispersed in the first transparent body, and wherein the first transparent body is configured to deform by the pressurizing.

21. The method according to claim 20, wherein the first transparent body is a thermosetting resin, and wherein the thermosetting resin is cured after causing the thermosetting resin to deform by pressing with a pressurizing tool in a half-cured state.

22. The method according to claim 20, further comprising filling a transparent resin into the gap in the phosphor layer.

23. The method according to claim 19, further comprising for each of the plurality of chips, causing the light emitting layer to emit light and measuring an optical characteristic of light emitted from the first surface of the semiconductor layer, wherein a pressurizing amount of a corresponding region of the phosphor layer is controlled according to the measured optical characteristic.

24. The method according to claim 23, wherein the corresponding region of the phosphor layer is pressurized while simultaneously measuring the optical characteristic.

25. The method according to claim 24, wherein the light is guided to a measuring apparatus via a pressurizing tool while the corresponding region of the phosphor layer is pressed with the pressurizing tool.

26. The method according to claim 25, wherein the corresponding region of the phosphor layer is pressed with the pressurizing tool via a protective film adhered to a top surface of the phosphor layer, the protective film being transparent to the light.

27. The method according to claim 23, wherein a p-side external terminal and an n-side external terminal are exposed on a side of the second surface of the semiconductor layer, the p-side external terminal being electrically connected to the p-side electrode, and the n-side external terminal being electrically connected to the n-side electrode, and wherein the optical characteristic is measured by causing the light emitting layer to emit light by causing a probe to contact the p-side external terminal and the n-side external terminal and supplying a current to the light emitting layer.

28. The method according to claim 19, wherein a width of an upper portion in the gap on an upper end side of the phosphor layer is wider than a width of a bottom portion in the gap on a lower end side of the phosphor layer.

29. The method according to claim 19, wherein the gap in the phosphor layer in each of the plurality of chips has a different size.

* * * * *